US012588236B2

(12) United States Patent
Hornung et al.

(10) Patent No.: US 12,588,236 B2
(45) Date of Patent: Mar. 24, 2026

(54) TWO-ROTATION GATE-EDGE DIODE LEAKAGE REDUCTION FOR MOS TRANSISTORS

(71) Applicant: Texas Instruments Incorporated, Dallas, TX (US)

(72) Inventors: Brian Edward Hornung, Richardson, TX (US); Mahalingam Nandakumar, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/667,347

(22) Filed: May 17, 2024

(65) Prior Publication Data

US 2024/0304723 A1 Sep. 12, 2024

Related U.S. Application Data

(62) Division of application No. 17/135,541, filed on Dec. 28, 2020, now Pat. No. 12,009,423.

(51) Int. Cl.
*H10D 30/60* (2025.01)
*H01L 21/265* (2006.01)
(Continued)

(52) U.S. Cl.
CPC ..... *H10D 30/601* (2025.01); *H01L 21/26513* (2013.01); *H01L 21/26586* (2013.01); *H01L 21/266* (2013.01); *H10D 30/022* (2025.01); *H10D 62/834* (2025.01); *H10D 84/013* (2025.01); *H10D 84/038* (2025.01); *H10D 84/83* (2025.01)

(58) Field of Classification Search
CPC ........... H01L 21/26513; H01L 21/2652; H01L 21/26586; H01L 21/266; H10D 30/022; H10D 30/0227; H10D 30/601; H10D 62/151; H10D 62/299; H10D 62/834; H10D 84/0128; H10D 84/013; H10D 84/83
See application file for complete search history.

(56) References Cited

U.S. PATENT DOCUMENTS 7,151,032 B2 12/2006 Kim
8,753,944 B2 6/2014 Nandakumar et al.
(Continued)

*Primary Examiner* — Sonya McCall-Shepard
(74) *Attorney, Agent, or Firm* — Andrew R. Ralston; Frank D. Cimino

(57) ABSTRACT

An integrated circuit is fabricated by forming transistors having gates of orthogonal orientations and implanting, at two first rotations, a first pocket implant using a first dopant type with a masking pattern on a substrate surface layer, the two first rotations respectively forming two first pocket implantation angles and two first pocket implantation beam orientations, and implanting, at two second rotations, a retrograde gate-edge diode leakage (GDL) reduction pocket implant using a second dopant type with the masking pattern on the substrate surface layer, the two second rotations respectively forming two GDL-reduction implantation angles and two GDL-reduction implantation beam orientations. Owing to the different symmetries in implantation angles seen by the two orientations of transistors, leakage is reduced for transistors of both orientations and mismatch is maintained for transistors of one of the orientations, making these transistors suitable for use in analog circuits requiring matched pairs of transistors.

16 Claims, 17 Drawing Sheets

(51) Int. Cl.

| | |
|---|---|
| *H01L 21/266* | (2006.01) |
| *H10D 30/01* | (2025.01) |
| *H10D 62/10* | (2025.01) |
| *H10D 62/13* | (2025.01) |
| *H10D 62/17* | (2025.01) |
| *H10D 62/834* | (2025.01) |
| *H10D 84/01* | (2025.01) |
| *H10D 84/03* | (2025.01) |
| *H10D 84/83* | (2025.01) |

(56) References Cited

U.S. PATENT DOCUMENTS

| | | | |
|---|---|---|---|
| 2007/0105326 | A1 | 5/2007 | Anderson et al. |
| 2007/0224755 | A1 | 9/2007 | Tanaka |
| 2008/0179691 | A1 | 7/2008 | Benaissa et al. |

α = "ROTATION"
β = "TILT"

1700

1800

TWO-ROTATION GATE-EDGE DIODE LEAKAGE REDUCTION FOR MOS TRANSISTORS

CROSS REFERENCE TO RELATED APPLICATIONS

This application is a divisional of application Ser. No. 17/135,541, issued as U.S. Pat. No. 12,009,423.

TECHNICAL FIELD

This description relates generally to semiconductor fabrication, and more particularly to a two-rotation gate-edge diode leakage (GDL) implant at drain extensions to reduce leakage while maintaining mismatch in metal-oxide-semiconductor (MOS) transistors.

BACKGROUND

For high-performance complementary MOS (CMOS) transistors, channel profile and source/drain extension (lightly doped drain (LDD) or heavily doped drain (HDD)) engineering may be used. Lowering band-to-band (B2B) gate-edge diode leakage (GDL), which results in, and can be a major component of, off-state current leakage $I_{Off}$, is a challenge particularly for low-leakage (e.g., ultra-low-leakage (ULL)) high-voltage-threshold (HVT) MOS transistors. Pocket implants (also referred to as halo implants) self-aligned to the edge of the gate, which are used to lower short-channel effects in scaled CMOS transistors, typically increase GDL. While implantation of pocket implants at a higher implantation angle tends to mitigate this increased GDL, it also tends to increase transistor mismatch. In addition, the implant angle is typically limited to about 20° to 30° because of blocking by protruding masking photoresist and/or the adjacent gate electrode (e.g., a polysilicon gate).

SUMMARY

An example method of fabricating an integrated circuit (IC) includes providing a substrate having a surface layer with a first conductivity type and having a top surface, a first gate over the surface layer having a long axis with a first orientation for a first transistor, and a second gate over the surface layer having a long axis with a second orientation for a second transistor, the second orientation being about orthogonal to the first orientation in a plane of the top surface. A pocket implant is implanted adjacent the first and second gates using a first dopant having the first conductivity type, the pocket implant having a first rotation angle and a first implantation angle. A retrograde gate-edge diode leakage (GDL) reduction implant is implanted adjacent the first and second gates using a second dopant having a second opposite conductivity type, the GDL-reduction implant having a second rotation angle and a second implantation angle, the second rotation angle differing from the first rotation angle by at least 10°.

An example metal-oxide-semiconductor (MOS) transistor includes a semiconductor substrate having a surface layer having a well region having a first conductivity type. The MOS transistor further includes a gate formed over the well region. The gate has a long axis. The MOS transistor further includes a source/drain region and a source/drain extension to the source/drain region formed in the surface layer, both having a second conductivity type. The source/drain extension extends under the gate. The MOS transistor further includes a gate edge diode leakage (GDL) reduction region having the second conductivity type extending from under the gate to the source/drain region. The MOS transistor further includes a first counterdoped pocket portion extending from the GDL-reduction region toward the source/drain region and having the second conductivity type and a lower charge carrier density than the GDL-reduction region. The MOS transistor further includes a second counterdoped pocket portion extending from the first counterdoped pocket portion to the source/drain region and having the first conductivity type and a lower charge carrier concentration than the well region.

An example IC includes a substrate having a surface layer having a well region having a first conductivity type and having a top surface. The IC further includes first and second MOS transistors formed on the surface layer. Each of the first and second MOS transistors includes a gate formed over the well region. The gate of the first MOS transistor has a long axis with a first orientation. The gate of the second MOS transistor has a long axis with a second orientation that is about orthogonal to the first orientation in a plane of the top surface. Each of the first and second MOS transistors further includes a source/drain region and a source/drain extension to the source/drain region formed in the surface layer, both having a second conductivity type. The source/drain extension extends under the gate. The first MOS transistor further includes a pocket region having the first conductivity type extending from under the gate of the first MOS transistor to the source/drain region of the first MOS transistor. The first MOS transistor further includes a first retrograde GDL-reduction portion extending from the pocket region toward the source/drain region of the first MOS transistor and having the first conductivity type and a lower charge carrier density than the pocket region. The second MOS transistor further includes a GDL-reduction region having the second conductivity type extending from under the gate of the second MOS transistor to the source/drain region of the second MOS transistor. The second MOS transistor further includes a first counterdoped pocket portion extending from the GDL-reduction region toward the source/drain region of the second MOS transistor and having the second conductivity type and a lower charge carrier density than the GDL-reduction region. The second MOS transistor further includes a second counterdoped pocket portion extending from the first counterdoped pocket portion to the source/drain region and having the first conductivity type and a lower charge carrier concentration than the well region of the second MOS transistor.

DETAILED DESCRIPTION

In the fabrication of integrated circuit (IC) devices, it can often be important for adjacent transistors (e.g., those placed within about tenth of a micron to twelve microns of each other on a chip), and particularly those transistors used as matched pairs (e.g., in operational amplifiers), to have low mismatch, a term that refers to a comparison of various parametrics between two transistors. Factors affecting mismatch include variations in gate thickness, gate dielectric (e.g., gate oxide) thickness, and doping profile, the latter of which tends to dominate for larger transistors (e.g., those having gate lengths one micron or greater) that are used in analog circuitry. In accordance with the Pelgrom relationship, increasing transistor size can be one way of reducing mismatch, but larger device sizes have drawbacks, such as occupying larger area on chip. Thermally grown gate oxides can be very well controlled for thickness, and gate oxides can be precisely nitrided to control their properties, such that gate oxide fabrication techniques do not present much opportunity for reduction of mismatch. Accordingly, transistor fabrication techniques involving variation in the doping profile in a MOS transistor channel may offer the greatest opportunity for mismatch reduction. However, mismatch-improving fabrication techniques that result in a more abrupt doping profile tend to result in a higher electric field in portions of the transistor channel during device operation and thus can increase the GDL. The present application describes a two-rotation GDL reduction implant process that effectively lowers GDL, particularly in ICs fabricated to have different types of transistors respectively configured for different purposes (e.g., for use in analog circuitry versus for use in digital logic or for input/output circuitry).

Figure 1A:
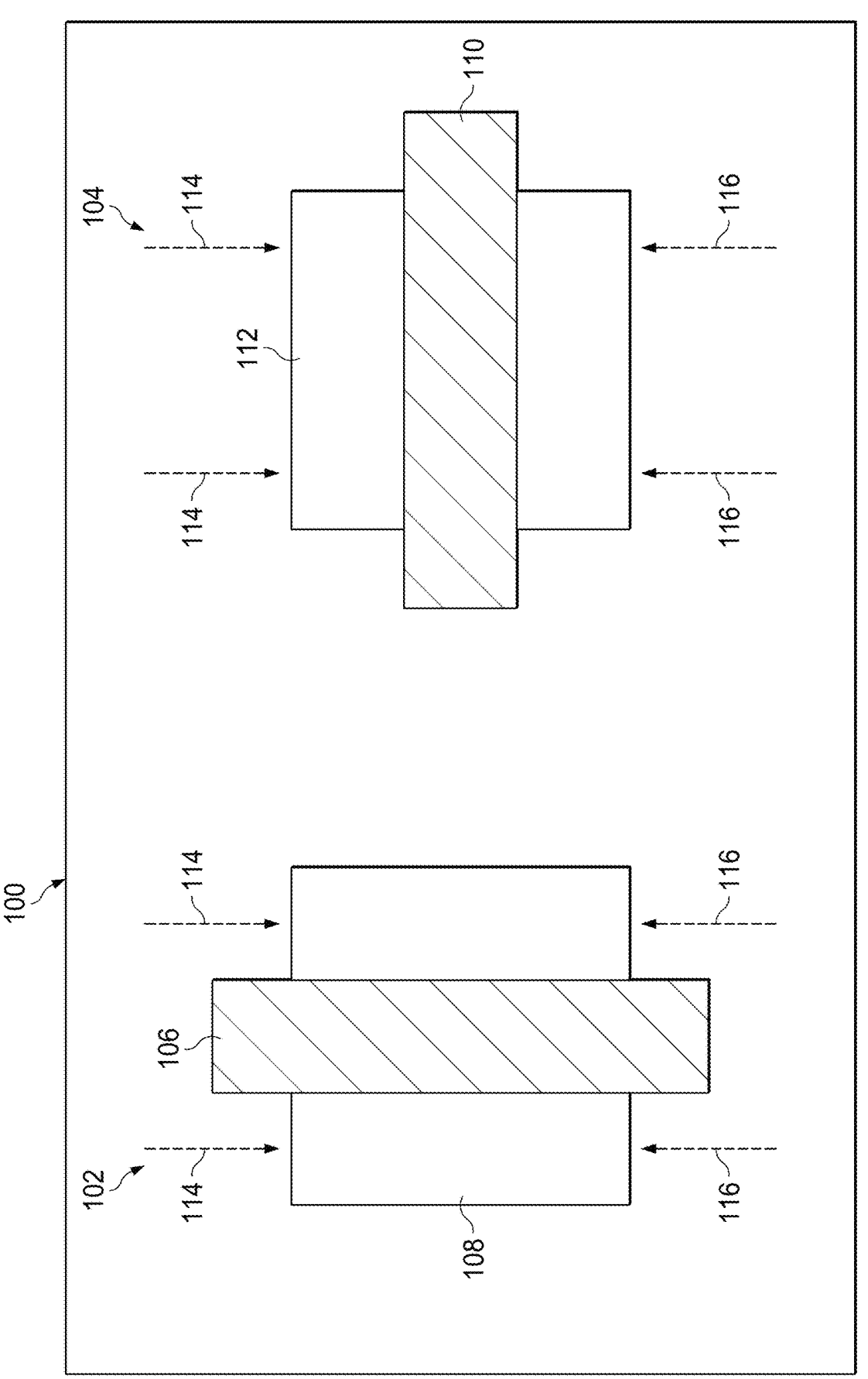
FIG. 1A is a top-down view of an example portion of an IC having MOS transistors of orthogonal respective orientations.

The top-down view of FIG. 1A shows an example portion 100 of an IC on which transistors 102, 104 have been fabricated with long axes having orientations that are orthogonal with respect to each other. The IC can be fabricated, for example, using an advanced CMOS/Linear bipolar CMOS (BiCMOS) process, in which a variety of devices such as diodes, resistors, bipolar junction transistors, power MOS and CMOS transistors may be fabricated on a single IC. Although only two transistors 102, 104 are shown in the example portion 100, the IC may include many other transistors and devices. For example, the IC may include multiple instances of transistors 102, 104. FIG. 1A is not necessarily to scale either with respect to the relative sizes of the transistors 102, 104 or their distance from each other.

The IC portion 100 of FIG. 1A can be fabricated on a larger semiconductor wafer that can be placed on a platen in an implant chamber capable of directing an ion beam at the wafer to implant ions into the wafer. The angle of the platen can be adjusted relative to the incident beam to provide a number of "rotations," such as a first rotation supplying first-angle GDL-reduction ion beams 114 incident at a first angle and a second rotation supplying second-angle GDL-reduction ion beams 116 incident at a second angle. Although, in the top-down view of FIG. 1A, the arrows representing beams 114, 116 may appear to be coming in at the sides of the transistors parallel to the wafer plane, this is an artifact of three-dimensional arrows being represented in the two-dimensional space of the drawing. The arrows representing beams 114, 116 should be understood as coming down on the transistors 102, 104 at some angle less than 90° from the normal to the top surface 108, 112 of the substrate surface layer.

First transistor 102, having a first orientation, can include gate 106 deposited on top of active area 108, which has been doped to form source/drain regions, as well as drain extensions, which are also known as LDDs or HDDs depending on the level of doping. Second transistor 104, having a second orientation that is about orthogonal to the first orientation in the wafer plane, can include gate 110 deposited on top of active area 112, which also has been doped to form source/drain regions and drain extensions. Active areas 108, 112 may be individually surrounded on the wafer by isolation barriers (formed, e.g., from oxide) (not shown in FIG. 1A, but see FIGS. 5, 6, 7, and 9), which can promote electrical isolation of adjacent transistors on the IC. In some examples, first transistor 102 can be a "core" transistor configured for use in digital logic circuitry, typically having gate lengths at or close to the minimum critical dimension (CD) for the technology (e.g., between about 20 nm and about 100 nm). The operating voltage of these transistors can be, for example, between about 0.8 V and about 1.5 V depending on the gate oxide thickness. In some other examples, first transistor 102 can be configured for use in input-output (I/O) circuitry and have a longer gate length and/or a thicker gate oxide. The operating voltage of these transistors are typically higher than the core transistors, for example, between about 1.5 V and about 5 V. In some examples, second transistor 104 can be an "analog-friendly" CMOS transistor configured for use in analog circuitry, such as differential amplifiers, in which matched transistor pairs having very low mismatch are desired.

Figure 1B:
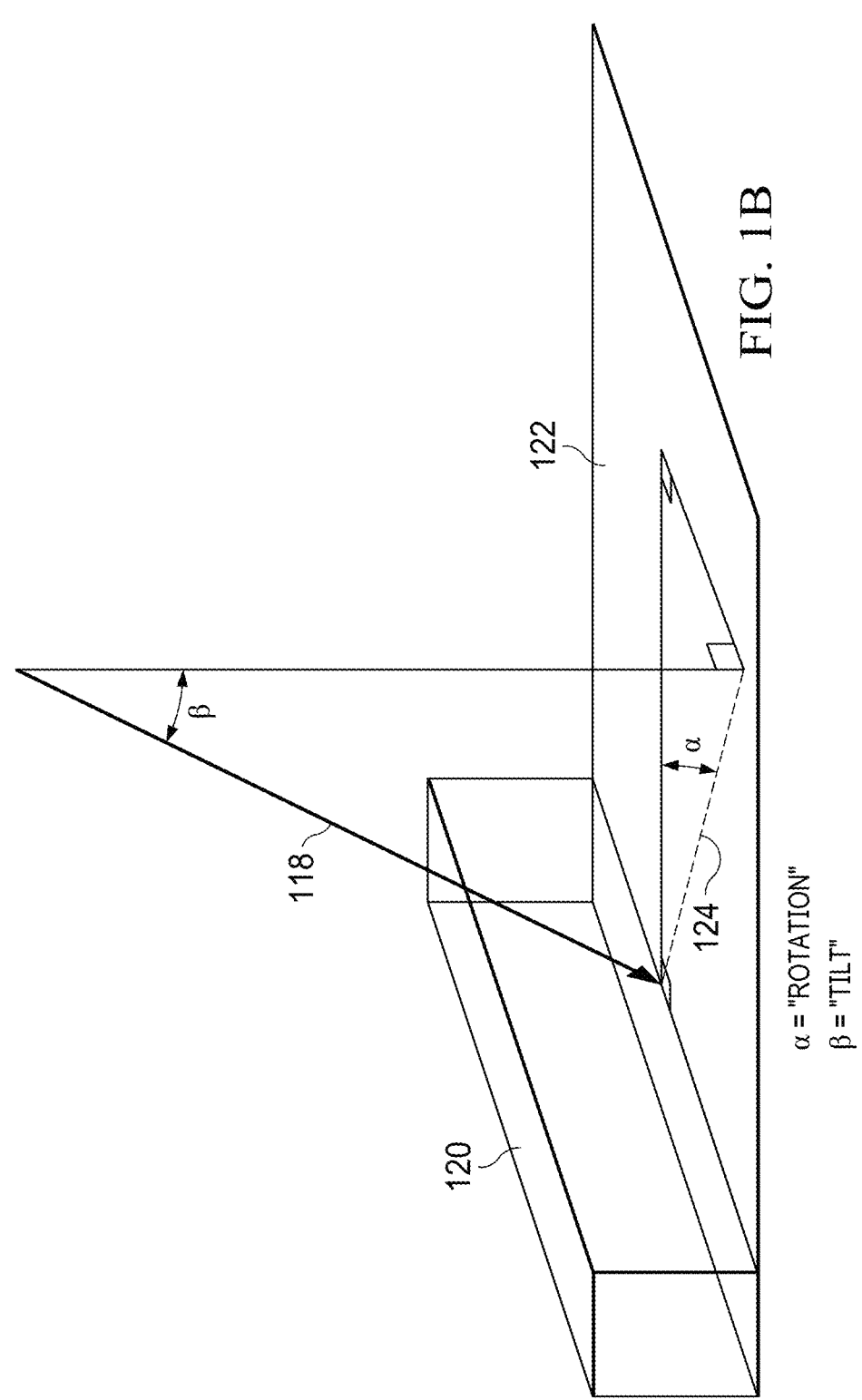
FIG. 1B is an orthographic projection view of an example MOS transistor gate showing the relationship between implant beam rotation a and tilt p.

The direction of an implant beam with respect to a transistor at which the beam is directed can be described by a rotation angle $\alpha$ around a vertical z-axis normal to the surface of the substrate in which the transistor is fabricated, corresponding to rotation of the platen and also referred to in the art as twist, and a tilt angle $\beta$ from the vertical axis (the surface normal). FIG. 1B shows an implant beam 118 incident a top surface 122 of a substrate adjacent a transistor gate 120. The three-dimensional implant beam 118 has a two-dimensional projection 124 on the plane of the top surface 122. The rotation angle or twist of the implant beam 118 is represented by the angle $\alpha$ between the projection 124 and a line on the surface 122 perpendicular to the long-axis edge of the gate 120. The tilt of the implant beam 118 is represented by the angle $\beta$ between the implant beam 118 and a vertical line normal to the top surface 122 and intersecting the projection 124. As used herein, "rotation angle" is defined as the angle $\alpha$, and "implantation angle" is defined as the angle $\beta$. A first rotation angle is defined as "opposite" a second rotation angle when the projection into the substrate plane of the implant beam associated with the first rotation angle is 180° from the projection into the substrate plane of the implant beam associated with the second rotation angle.

Figures 2, 3:
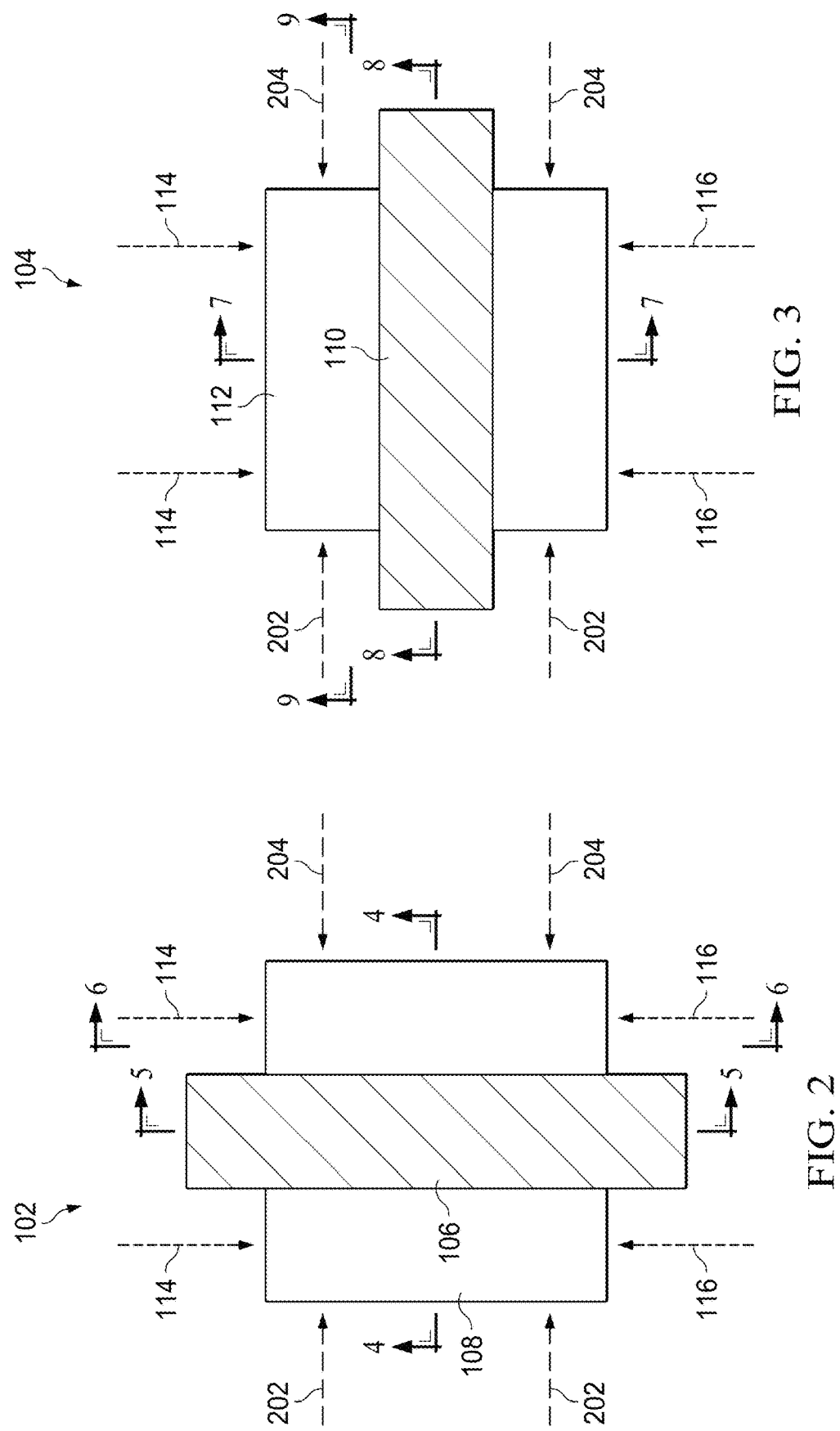
FIG. 2 is a top-down view of an example NMOS transistor having a first orientation and showing implant directions and cross-section cuts.
FIG. 3 is a top-down view of an example NMOS transistor having a second orientation, orthogonal to the first orientation, and showing implant directions and cross-section cuts.

FIGS. 2 and 3 respectively illustrate transistors 102, 104 and show section cuts 4, 5, and 6 in transistor 102 and section cuts 7, 8, and 9 in transistor 104, each of the section cuts respectively corresponding to the view shown in the figure of the same number. The gate 106 of transistor 102 in FIG. 2 has a long axis having a first orientation indicated by the direction of section cut 5. The gate 110 of transistor 104 in FIG. 3 has a long axis having a second orientation, about orthogonal to the first orientation, indicated by the direction of section cut 8. FIGS. 2 and 3 also show arrows 114, 116, 202, and 204 indicating the directions of ion beams of a first pocket implant 202, a second pocket implant 204, first retrograde GDL-reduction implant 114, and second retrograde GDL-reduction implant 116. As noted above, the beam arrows should be understood as coming down on the transistors 102, 104 at some tilt angle $\beta$ less than 90° from the normal to the top surface 108, 112 of the substrate surface layer, and not as being parallel with the plane of the top-down view shown in FIGS. 2 and 3. Second pocket implant 204 can be implanted at a third rotation angle about opposite to the first rotation angle by which first pocket implant 202 is implanted. This third rotation angle can thus be referred to as an opposite rotation angle. Similarly, second retrograde GDL-reduction implant 116 can be implanted at a fourth rotation angle about opposite to the second rotation angle by which first retrograde GDL-reduction implant 114 is implanted. This fourth rotation angle can thus also be referred to as an opposite rotation angle, in that it can be about opposite to the second rotation angle. In some examples, the first, second, third, and fourth rotation angles are separated about 90° from one to the next.

Figure 4A:
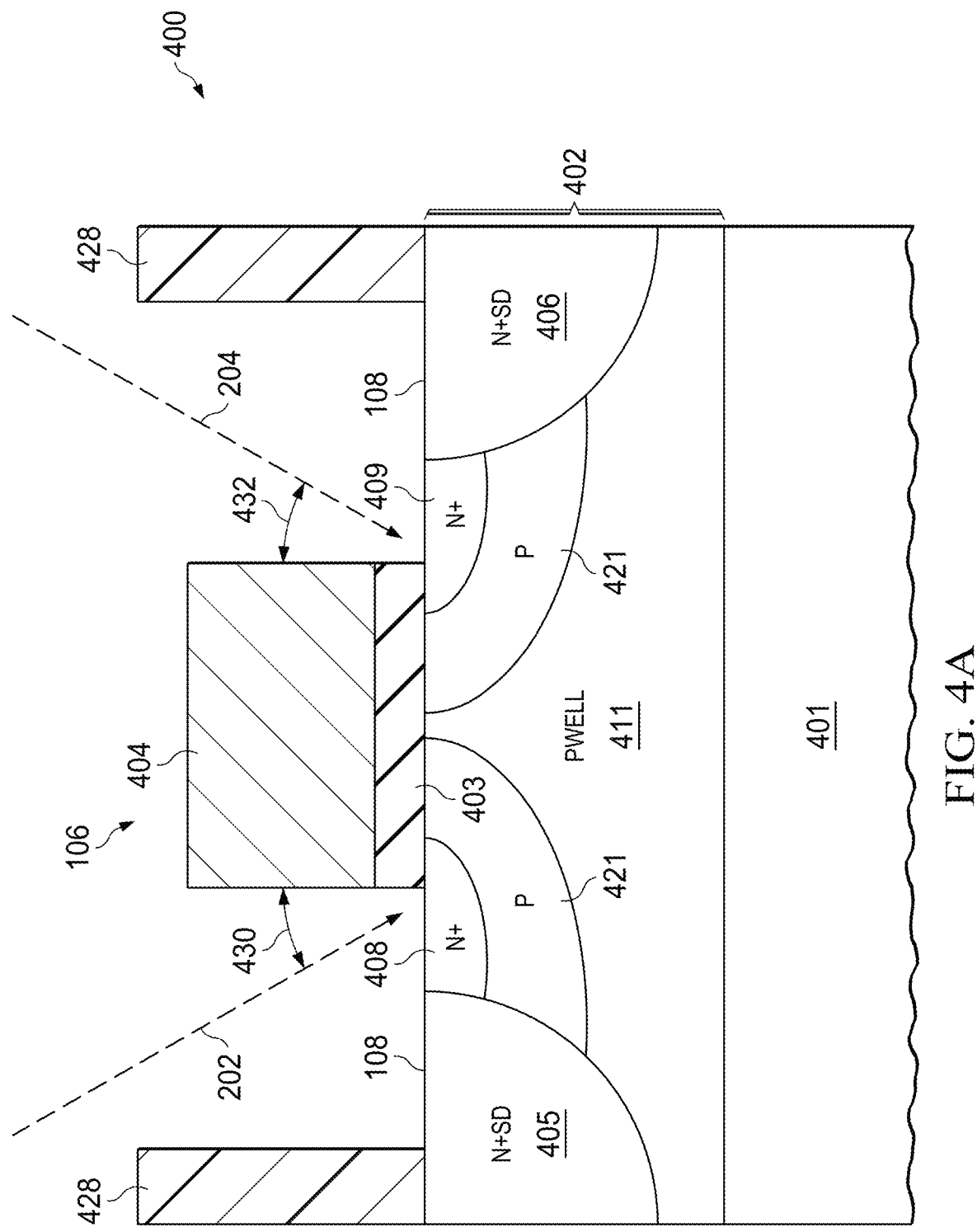
FIG. 4A is a cross-sectional view of a portion of an example first-orientation NMOS transistor after doping with 2-rotation pocket implants, prior to doping with 2-rotation retrograde GDL reduction implants.
Figure 4B:
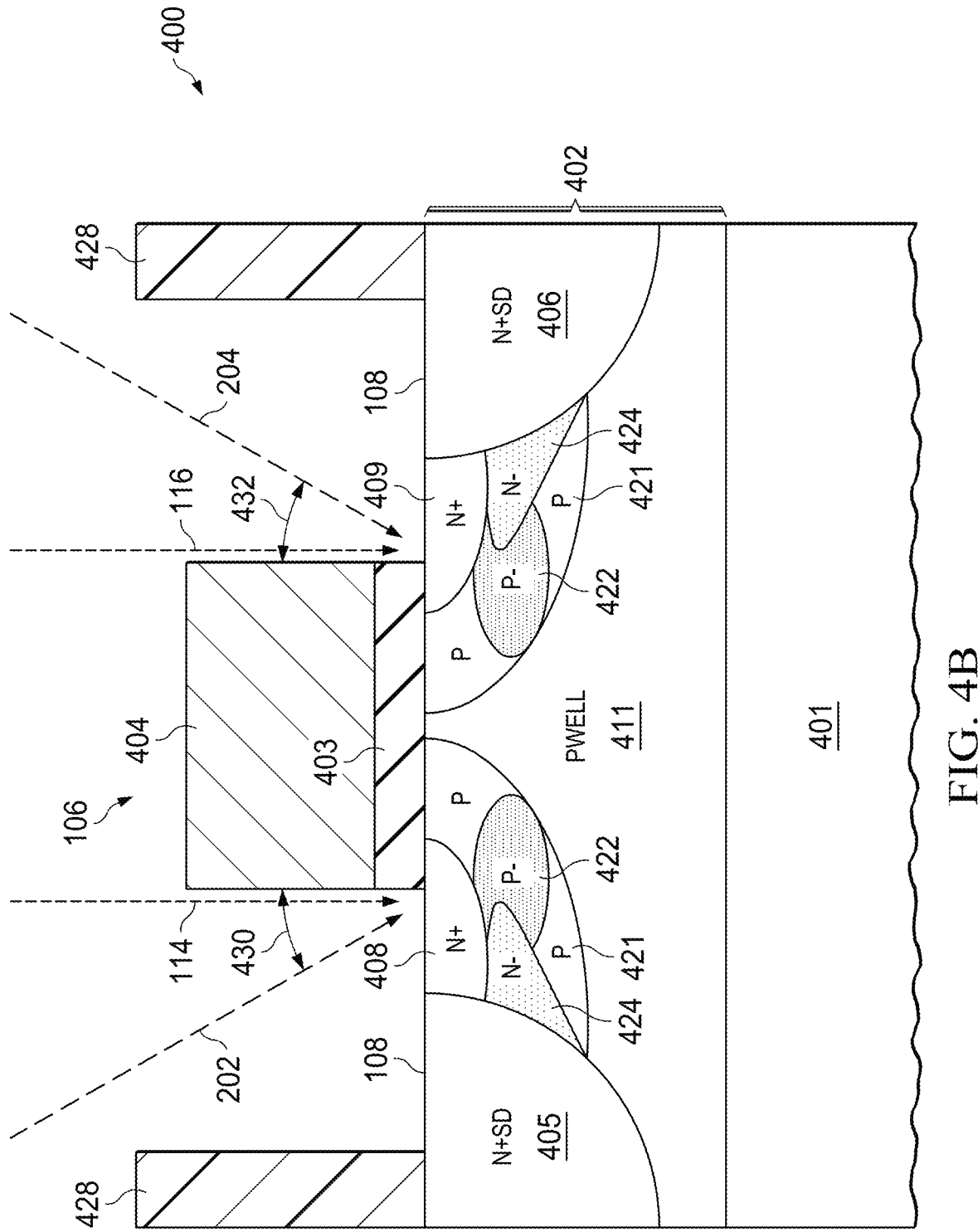
FIG. 4B is a cross-sectional view of a portion of an example first-orientation NMOS transistor after completion of doping and annealing using a fabrication method including 2-rotation retrograde GDL reduction implants.

FIGS. 4A and 4B are cross-sectional views of an example first-orientation MOS transistor 400, shown as an NMOS transistor. FIG. 4A shows the first-orientation NMOS transistor after doping with 2-rotation pocket implants 202, 204, prior to doping with 2-rotation retrograde GDL reduction implants 114, 116, whereas FIG. 4B shows the first-orientation NMOS transistor after completion of doping and annealing using a fabrication method including two pocket implants 202, 204 and two GDL-reduction implants 114, 116. Although the sequence of FIGS. 4A, 4B shows the pocket implants 202, 204 as coming prior to the GDL-reduction implants 114, 116, these implants can be performed in either order prior to annealing.

Although FIGS. 4A and 4B illustrate an NMOS transistor, the MOS transistors can be PMOS, having conductivity types opposite of those shown, and either type of transistor can be fabricated on, for example, a CMOS IC or on a BiCMOS IC. The view of FIGS. 4A and 4B corresponds to the section cut 4 of FIG. 2, and first-orientation transistor 400 can correspond to transistor 102 of FIGS. 1A and 2. First-orientation transistor 400 is fabricated on a substrate 401 having a surface layer 402, which can be a single-crystal silicon substrate doped n-type. In other examples (not illustrated), the substrate 401 may be doped p-type, or may be an epitaxial (e.g., silicon) layer on a single-crystal substrate.

First-orientation transistor 400 is shown formed in a pwell 411 that is implanted and/or diffused into the surface layer 402. The pwell 411 may be isolated from other devices formed over the substrate 401 by dielectric structures (e.g., shallow trench isolation) and/or deep isolation wells (not shown). A p-type dopant for an NMOS transistor is referred to herein as the first dopant type or as having the first conductivity type. A gate stack, corresponding to gate 106 in FIGS. 1A and 2, including gate dielectric layer 403 with a gate electrode 404 thereon, is on the top surface 108 of the pwell 411. First-orientation transistor 400 also includes an (n+) doped source 405, and an (n+) doped drain 406. Implants to create source/drain regions 405, 406 may be performed prior to the implantations of pocket implants to form regions 421 and LDD implants to form regions 408, 409 using a disposable spacer flow, or can be performed later in the flow, following GDL-reduction implants to form regions 422, 424 with a separate pattern level after depositing spacer regions used to space the source/drain regions 405, 406 away from the edge of the gate 106. An n-type dopant for first-orientation transistor 400 is referred to herein as the second dopant type or as having the second conductivity type.

The gate dielectric layer 403 can comprise silicon oxide, nitrogen-doped silicon dioxide, silicon oxy-nitride, hafnium oxide, layers of silicon dioxide and silicon nitride, or other electrically insulating material, and may be, for example, between about 1 nanometer and about 3 nanometers thick. Gate electrode 404 can comprise polycrystalline silicon doped n-type (or doped p-type for PMOS) with a silicide formed on top, or a metal or metal compound such as titanium, tungsten, titanium nitride (TiN), tantalum, or tantalum nitride (TaN) for replacement metal gate examples. First-orientation transistor 400 may, in some examples, be fabricated with spacers (not shown) on the sidewalls of the gate stack. Source/drain extensions include a source extension 408 and a drain extension 409, both doped n-type for NMOS. As noted above, these source/drain extensions may also be referred to as lightly-doped drains (LDDs) or heavily-doped drains (HDDs), depending on the level of doping used.

First-orientation transistor 400 may be electrically insulated from other devices fabricated on the same IC by a shallow trench isolation structure (STI) (not shown in FIG. 4A or 4B) formed within the surface layer 402. Other isolation structures may also be used, such as field oxidation regions (also known as local oxidation of silicon (LOCOS) regions) or implanted isolation regions.

First-orientation transistor 400 includes a pocket distribution of p-type dopant providing pocket regions 421 having the first conductivity type and shown extending from under the gate 106 (e.g., starting at about the surface of the pwell 411, e.g., intersecting the top 108 of the surface layer 402 under the gate dielectric layer 403) to a source/drain region 405 or 406. Pocket implants 202, 204 used to form pocket regions 421 may also be referred to as halo implants.

As shown in FIG. 4B, first-orientation transistor 400 also includes a retrograde GDL reduction distribution of n-type dopant providing a first retrograde GDL-reduction portion 422 and a second retrograde GDL-reduction portion 424. The retrograde GDL-reduction portions 422, 424 overlap with the pocket regions 421. First retrograde GDL-reduction portions 422 are shown counterdoped as (p–) and second retrograde GDL-reduction portions 422 are shown counter-doped as (n–). The first retrograde GDL-reduction portions 422, while being p-type, have a lower charge carrier (e.g., hole) density than the pwell 411 and the pocket regions 421. Second (n–) retrograde GDL-reduction portions 424 are shown dopant type inverted, where a concentration of the n-type dopant type exceeds the concentration of p-type dopant provided by pocket regions 421 plus pwell 411. The second retrograde GDL-reduction portions 424 have a lower charge carrier (e.g., hole) density than the source/drain regions 405/406 and/or the source/drain extensions 408/409. Second (n–) retrograde GDL-reduction portions 424 provide one side and first (p–) retrograde GDL-reduction portions 422 the other side of the buried n–/p– regions shown in FIG. 4B.

Unlike pocket regions 421, first and second retrograde GDL-reduction portions 422, 424 do not intersect the top surface 108. Each second retrograde GDL-reduction portion 424 is situated between and intersects with a respective first retrograde GDL-reduction portion 422 and a respective source/drain region 405 or 406. First retrograde GDL-reduction portions 422 are ahead of second retrograde GDL-reduction portions 424 in that first retrograde GDL-reduction portions 422 extend further under the gate 106. In the illustrated NMOS example, (p) pocket regions 421 result from pocket implants 202, 204, whereas first (p–) and second (n–) retrograde GDL-reduction portions 422, 424 result from pocket implants 202, 204 being compensated by GDL-reduction implants 114, 116. Implants for forming source/drain extensions 408, 409, pocket regions 421, and GDL-reduction regions 422, 424 can be performed with a mask, indicated in the cross-sectional view of FIGS. 4A and 4B by resist 428, to align the implants to the gate 106. In examples that use a metal gate, in which a nitride layer is replaced during the process flow, the resist 428 may be a nitride layer.

The retrograde GDL-reduction portions 422, 424 can be seen to create local regions of lower net doping and thus lower E field, thereby reducing the sub-surface band-to-band tunneling near the source/drain extensions 408, 409 and (n+) source/drain 405, 406 junctions, leading to a substantial reduction in the GDL. Additionally, the buried n–/p– regions 422, 424 are localized below the source/drain extensions 408, 409 and source/drain 405, 406 junctions, and do not intrude into the channel region of the first-orientation transistor 400, minimizing the impact to the threshold voltage $V_t$ and subthreshold (source) leakage of first-orientation transistor 400. Due to the minimized $V_t$ impact, the on-state performance of first-orientation transistor 400 is maintained while the total leakage of first-orientation transistor 400, which is a sum of the GDL, gate leakage, and source leakage, is reduced.

Regarding the fabrication method described in more detail below, the p– type dopant providing pocket regions 421 can be implanted at two rotations with respective beams indicated by arrows 202, 204 at respective tilt angles 430, 432 with respect to a normal to the top surface 108 of the substrate surface layer 402. In some examples, tilt angles 430, 432 can have the same value. The n-type dopant that forms retrograde GDL-reduction portions 422, 424 for first-orientation transistor 400 can be a large, relatively non-mobile ion (e.g., As or Sb for NMOS, or indium (In) for PMOS) and can be implanted at rotation angles such that the beams 114, 116 are more parallel to the orientation of the long axis of the gate 106 than they are perpendicular to the orientation of the long axis of the gate 106, as shown more clearly in FIGS. 1A and 2. The retrograde implants 114, 116 of n-type dopant can share the same LDD mask as the pocket implants 202, 204 and can be self-aligned to the gate edge of the gate stack 404, 403 of first-orientation transistor 400. Accordingly, regardless of the tilt angle from the normal to the top surface 108 of the substrate surface layer 402 at which beams 114, 116 are directed onto the surface of the active area 108, the GDL-reduction implant behaves as a 0° implant with respect to the first-orientation transistor 400. Thus, even after annealing, the GDL-reduction implant does not protrude much into the channel of first-orientation transistor 400, whereas, by contrast, the beams 202, 204 for pocket implant forming conventional first pocket regions 421 are aimed to implant the p– type dopant more substantially underneath the gate 106. The GDL-reduction implant and the pocket implant may be performed in either order, after deposition of the gate 106 and prior to annealing in the fabrication process.

In first-orientation transistor 400, offset spacers (not shown) can be formed before or after the pocket and GDL-reduction implants 202, 204, 114, 116. The p-type pocket dose to form pocket regions 421 can be adjusted (for example, to a slightly higher dose) to provide the same threshold voltage $V_t$ that would be obtained without the retrograde GDL-reduction regions 422, 424. The self-aligned GDL-reduction implants 114, 116 to form retrograde GDL-reduction portions 422, 424 create more graded source/drain extension and source/drain junctions as compared to the junctions resulting from a baseline process using a single pocket implant (that is, without the GDL-reduction implants 114, 116). The graded junction lowers the GDL current and can be obtained while maintaining the same threshold voltage $V_t$.

Figure 5:
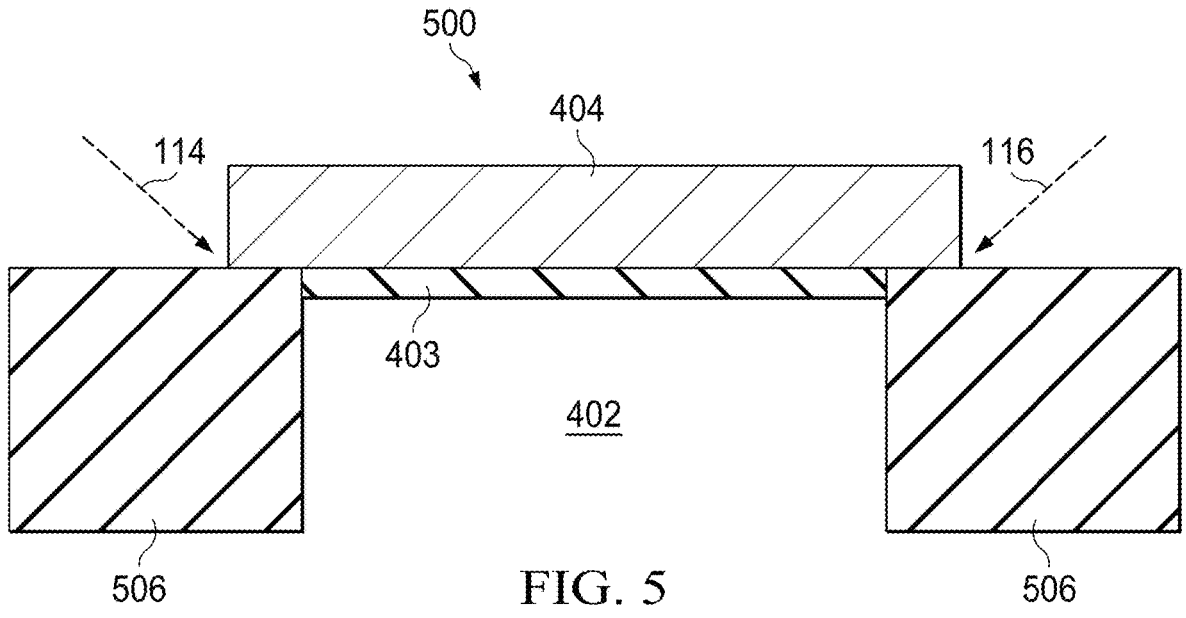
FIG. 5 is a through-the-gate longitudinal-section view of a portion of the first-orientation NMOS transistor, showing GDL reduction implant directions.

FIG. 5 is a through-the-gate longitudinal-section view of an example first-orientation NMOS transistor 500, which can correspond to first-orientation transistor 102 of FIGS. 1A and 2 and first-orientation NMOS transistor 400 of FIGS. 4A and 4B. The view of FIG. 5 corresponds to the section cut 5 of FIG. 2. Gate dielectric 403 underlies doped poly-silicon or metal gate 404. An example direction of a first-rotation GDL-reduction implant beam is indicated by arrow 114, and an example direction of a second-rotation GDL-reduction implant beam is indicated by arrow 116. As shown in FIG. 5, the portion of the surface layer 402 in which the transistor is formed by doping may be surrounded by isolation barrier 506.

Figure 6:
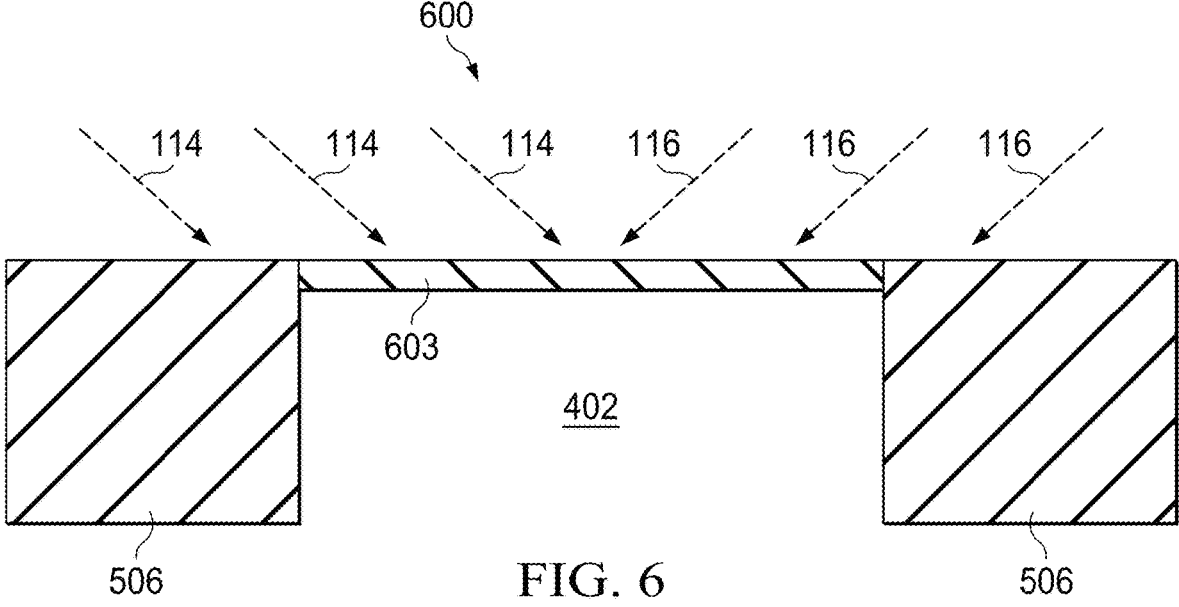
FIG. 6 is an off-the-gate longitudinal-section view of a portion of the first-orientation NMOS transistor through the source/drain implant regions, showing GDL reduction implant directions.

FIG. 6 is an off-the-gate longitudinal-section view of an example first-orientation NMOS transistor 600, which can correspond to first-orientation transistor 102 of FIGS. 1A and 2 and first-orientation NMOS transistor 400 of FIGS. 4A and 4B. The view of FIG. 6 corresponds to the section cut 6 of FIG. 2. An example direction of a first-rotation GDL-reduction implant beam is indicated by arrows 114, and an example direction of a second-rotation GDL-reduction implant beam is indicated by arrows 116. As viewed in the section cut of FIG. 6, in addition to being surrounded by isolation barrier 506, surface layer 402 may be covered by screen oxide 603. In FIGS. 5 and 6, the GDL-reduction implants 114, 116 can be performed at tilt angles of between about 5° from the normal to the top surface 108 of the substrate surface layer 402 and about 45° from the normal, for example, at tilt angles of about 30° from the normal. These GDL-reduction implant tilt angles can correspond to tilt angles 730 and 732 in FIG. 7B.

Figure 7A:
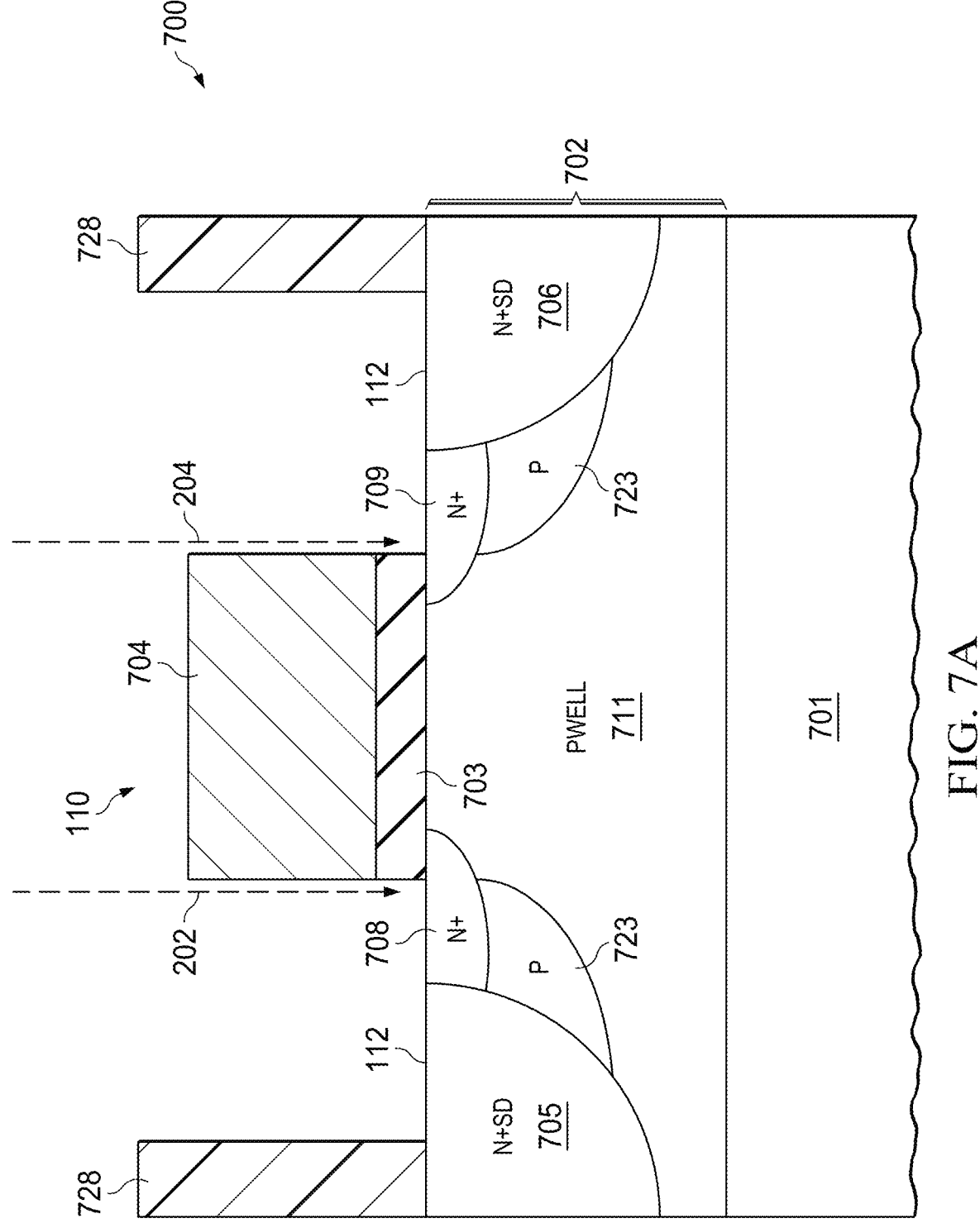
FIG. 7A is a cross-sectional view of a portion of an example second-orientation NMOS transistor after doping with 2-rotation pocket implants, prior to doping with 2-rotation retrograde GDL reduction implants.
Figure 7B:
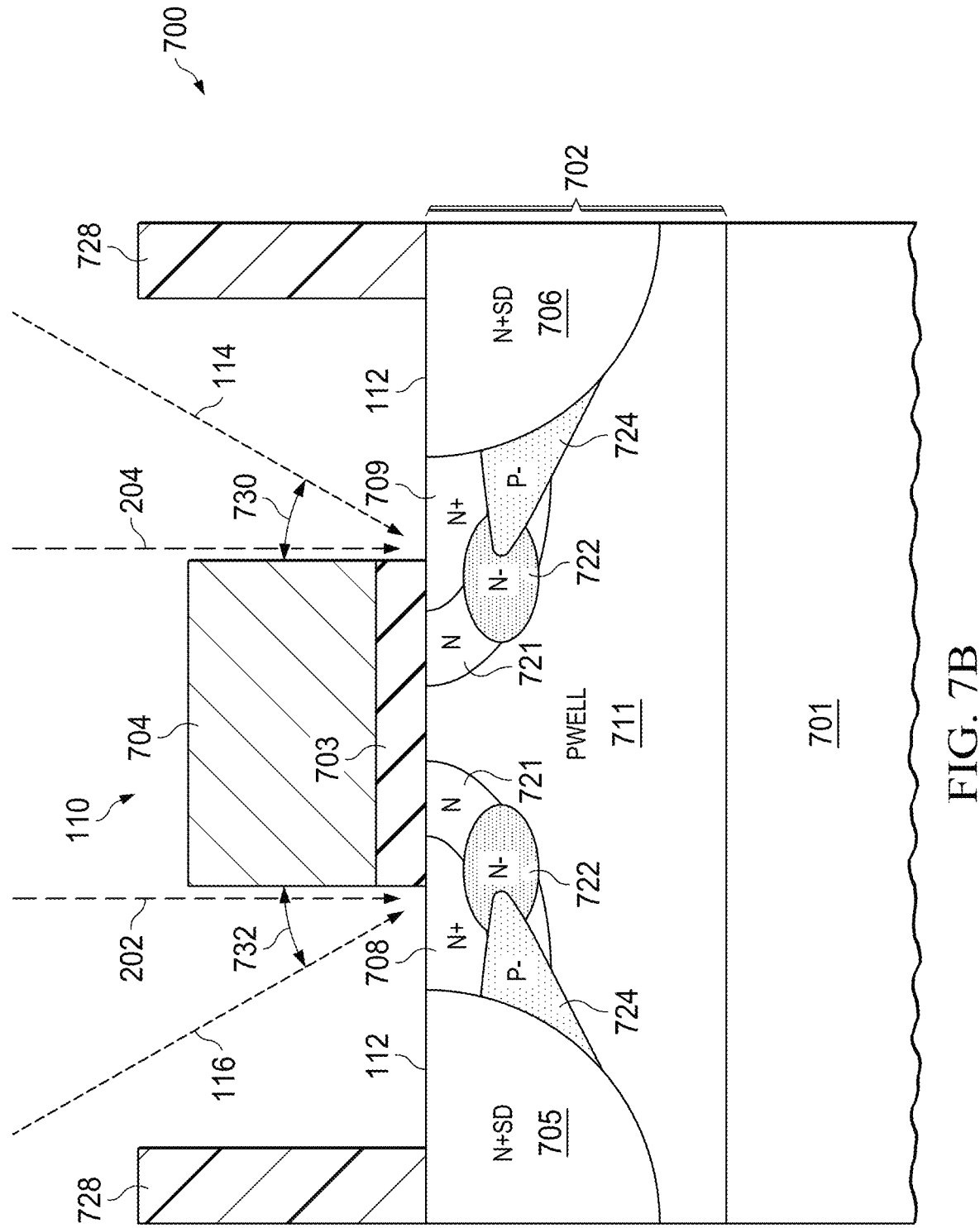
FIG. 7B is a cross-sectional view of a portion of an example second-orientation NMOS transistor after completion of doping and annealing using a fabrication method including 2-rotation retrograde GDL reduction implants.

FIGS. 7A and 7B are cross-sectional views of an example second-orientation MOS transistor 700, shown as an NMOS transistor. FIG. 7A shows the first-orientation NMOS transistor after doping with 2-rotation pocket implants 202, 204, prior to doping with 2-rotation retrograde GDL-reduction implants 114, 116, whereas FIG. 7B shows the second-orientation NMOS transistor after completion of doping and annealing using a fabrication method including two pocket implants 202, 204 and two GDL-reduction implants 114, 116. The energy of GDL-reduction implants 114, 116 is higher than the energy of the implant used to create source/drain extensions 708, 709 such that regions 721 extend ahead of source/drain regions 708, 709 underneath gate 110. Although the sequence of FIGS. 7A, 7B shows the pocket implants 202, 204 as coming prior to the GDL-reduction implants 114, 116, these implants can be performed in either order prior to annealing. FIG. 7A illustrates that, because of the orthogonal orientation of second-orientation transistor 700 with respect to first-orientation transistor 400 of FIGS. 4A and 4B, pocket implants 202, 204 are more parallel than perpendicular to the gate 110, such that pocket implants 202, 204 are effectively 0° implants for the second-orientation transistor, and consequently, pocket regions 723 do not extend to significantly underneath the gate 110, as do pocket regions 421 in FIG. 4A.

Although FIGS. 7A and 7B illustrate an NMOS transistor, the MOS transistors can be PMOS as well, having conductivity types opposite of those shown, and either type of transistor can be fabricated on, for example, a CMOS IC or on a BiCMOS IC. The view of FIGS. 7A and 7B corresponds to the section cut 7 of FIG. 3, and second-orientation transistor 700 can correspond to transistor 104 of FIGS. 1A and 3. Second-orientation transistor 700 is fabricated on a substrate 701, which in some examples can be the same substrate as substrate 401 of FIGS. 4A and 4B, having a surface layer 702, which can be a single-crystal silicon substrate doped n-type. In other examples (not illustrated), the substrate 701 may be doped p-type, or may be an epitaxial (e.g., silicon) layer on a single-crystal substrate.

Second-orientation transistor 700 is shown formed in a pwell 711 that is implanted and/or diffused into the surface layer 702. The pwell 711 may be isolated from other devices formed over the substrate 701 by dielectric structures (e.g., shallow trench isolation) and/or deep isolation wells (not shown). A gate stack, corresponding to gate 110 in FIGS. 1A and 3, including gate dielectric layer 703 with a gate electrode 704 thereon, is on the top surface 112 of the pwell 711. Second-orientation transistor 700 also includes an (n+) doped source 705, and an (n+) doped drain 706. Implants to create source/drain regions 705, 706 may be performed prior to the implantations of pocket implants to form regions 723 and LDD implants to form regions 708, 709 using a disposable spacer flow, or can be performed later in the flow, following GDL-reduction implants to form regions 721, 722, 724 with a separate pattern level after depositing spacer regions used to space the source/drain regions 705, 706 away from the edge of the gate 110.

The gate dielectric layer 703 can comprise silicon oxide, nitrogen-doped silicon dioxide, silicon oxy-nitride, hafnium oxide, layers of silicon dioxide and silicon nitride, or other electrically insulating material, and may be, for example, between about 1 nanometer and about 3 nanometers thick. Gate electrode 704 can comprise polycrystalline silicon doped n-type (or doped p-type for PMOS) with a silicide formed on top, or a metal or metal compound such as titanium, tungsten, titanium nitride (TiN), tantalum, or tantalum nitride (TaN) for replacement metal gate examples. Second-orientation transistor 700 may, in some examples, be fabricated with spacers (not shown) on the sidewalls of the gate stack. Source/drain extensions include a source extension 708 and a drain extension 709, both doped n-type for NMOS.

Second-orientation transistor 700 may be electrically insulated from other devices fabricated on the same IC by a shallow trench isolation structure (STI) (not shown in FIG. 7A or 7B) formed within the surface layer 702. Other isolation structures may also be used, such as field oxidation regions (also known as local oxidation of silicon (LOCOS) regions) or implanted isolation regions.

Second-orientation transistor 700 includes a GDL-reduction distribution of n-type dopant providing GDL-reduction regions 721, having the second conductivity type, and shown extending from under the gate 110 (e.g., starting at about the surface of the pwell 711, e.g., intersecting the top 112 of the surface layer 702 under the gate dielectric layer 703) to a source/drain region 705 or 706. Because GDL-reduction regions 721 are created by implantation of the n-type GDL-reduction species (e.g., As or Sb for NMOS), GDL-reduction regions 721 in FIG. 7B are labeled n, rather than p, as with first pocket regions 421 in FIGS. 4A and 4B. Conversely, in PMOS examples (not illustrated), in which the GDL-reduction regions 721 would be created by implantation of a p-type GDL-reduction species (e.g., In), GDL-reduction regions 721 would be labeled p, rather than n.

As shown in FIG. 7B, second-orientation transistor 700 also includes p-type dopant pocket regions that overlap with the GDL-reduction regions 721 to form first (n−) counterdoped pocket portions 722 and second (p−) counterdoped pocket portions 724. Second (p−) counterdoped pocket portions 724 are shown dopant type inverted, where a concentration of the p-type dopant type exceeds the concentration of n-type dopant provided by GDL-reduction regions 721. Second (p−) counterdoped pocket portions 724 provide one side and first (n−) counterdoped pocket portions 722 the other side of the buried p−/n− regions shown in FIG. 7B. The first counterdoped pocket portions 722 extend from the GDL-reduction regions 721 toward the source/drain regions 705, 706 and have the second conductivity type and a lower charge carrier density than the GDL-reduction region 721. The second counterdoped pocket portions 724 extend from the first counterdoped pocket portions 722 to the source/drain regions 705, 706 and have the first conductivity type and a lower charge carrier concentration than the well region 711.

Unlike GDL-reduction regions 721, counterdoped pocket portions 722, 724 do not intersect the top surface 112. Each second counterdoped pocket portion 724 is situated between and intersects with a respective first counterdoped pocket portion 722 and a respective source/drain region 705 or 706. First counterdoped pocket portions 722 are ahead of second counterdoped pocket portions 724 in that first counterdoped pocket portions 722 extend further under the gate 110. In the illustrated NMOS example, (n) GDL-reduction regions 721 result from GDL-reduction implants 114, 116, whereas first (n−) and second (p−) counterdoped pocket portions 722, 724 result from pocket implants 202, 204 being compensated by GDL-reduction implants 114, 116. Implants for forming source/drain extensions 708, 709, pocket regions 721, and pocket regions 722, 724 can be performed with a mask, indicated in the cross-section of FIG. 7B by resist 728, to align the implants to the gate 110. In examples that use a metal gate, in which a nitride layer is replaced during the process flow, the resist 728 may be a nitride layer.

The buried p–/n– regions 722, 724 are localized below the source/drain extensions 708, 709 and source/drain 705, 706 junctions and do not intrude into the channel region of the second-orientation transistor 700, minimizing the impact to the mismatch of second-orientation transistor 700. In contrast with the implant configuration shown in FIG. 4B, in which the GDL-reduction implant beams 114, 116 are tilt-angled (and, hence, the GDL-reduction implant regions 422, 424 are positioned) such that they do protrude into the channel, owing to the difference in orientation of transistor 700 versus transistor 400, the tilts of GDL-reduction implant beams 114, 116 are angled to deliberately put the GDL-reduction implant ions into the channel of transistor 700, lowering the resistance of the source/drain extension regions 708, 709, thus enhancing the drive current performance of transistor 700.

Regarding the fabrication method described in more detail below, the n– type GDL-reduction dopant providing first pocket regions 721 can be a large, relatively non-mobile ion (e.g., As or Sb for NMOS, or In for PMOS) and can be implanted at two rotations with respective beams indicated by arrows 114, 116 at respective tilt angles 730, 732 with respect to the normal to the top surface 112 of the substrate surface layer 702. In some examples, tilt angles 730, 732 can have the same value. The p-type dopant that forms pocket regions 722, 724 for second-orientation transistor 700 can be a light, relatively rapidly diffusing ion (e.g., B for NMOS, or phosphorous for PMOS) and can be implanted at rotation angles such that the beams 202, 204 are more parallel to the orientation of the long axis of the gate 110 than they are perpendicular to the orientation of the long axis of the gate 110, as shown more clearly in FIG. 3. The p-type dopant implants 202, 204 can share the same LDD mask as the retrograde implants 114, 116 of n-type dopant and can be self-aligned to the gate edge of the gate stack 704, 703 of second-orientation transistor 700. Accordingly, regardless of the angle from the normal to the top surface 112 of the substrate surface layer 702 at which beams 202, 204 are directed onto the top surface of the active area 112, the p-type implant behaves as a 0° implant with respect to the second-orientation transistor 700. This is in contrast to the first-orientation transistor 400, in which it is the n-type GDL-reduction implants that are more parallel to the orientation of the long axis of gate 106 and behave as a 0° implant with respect to the first-orientation transistor 400. In examples in which first orientation transistor 400 and second-orientation transistor 700 are fabricated together on the same IC, as few as four rotations of the wafer can be used to accomplish the p-type (pocket) implants and the n-type (GDL-reduction) implants, corresponding to illustrated beams 202, 204, 114, and 116. In second-orientation transistor 700, offset spacers (not shown) can be formed before or after the various pocket implants.

Figure 8:
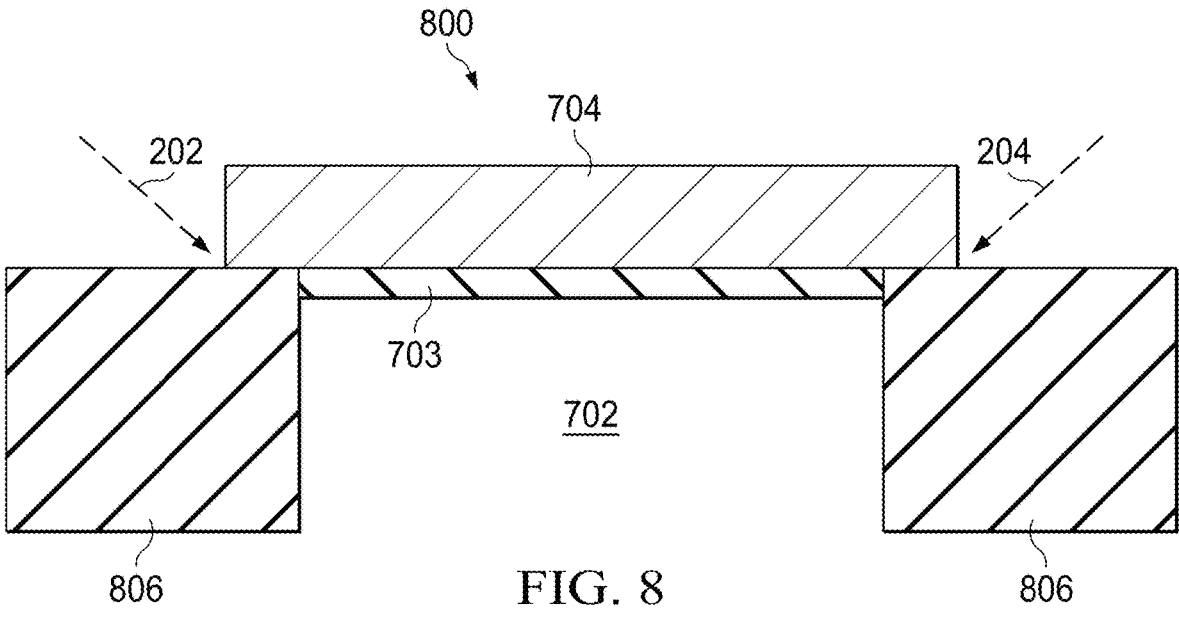
FIG. 8 is a through-the-gate longitudinal-section view of a portion of the second-orientation NMOS transistor, showing GDL reduction implant directions.

FIG. 8 is a through-the-gate longitudinal-section view of an example second-orientation NMOS transistor 800, which can correspond to second-orientation transistor 104 of FIGS. 1A and 3 and second-orientation NMOS transistor 700 of FIGS. 7A and 7B. The view of FIG. 8 corresponds to the section cut 8 of FIG. 3. Gate dielectric 703 underlies doped polysilicon or metal gate 704. An example direction of a first-rotation p-type pocket implant beam is indicated by arrow 202, and an example direction of a second-rotation p-type pocket implant beam is indicated by arrow 204. As shown in FIG. 8, the portion of the surface layer 702 in which the transistor is formed by doping may be surrounded by isolation barrier 806.

Figure 9:
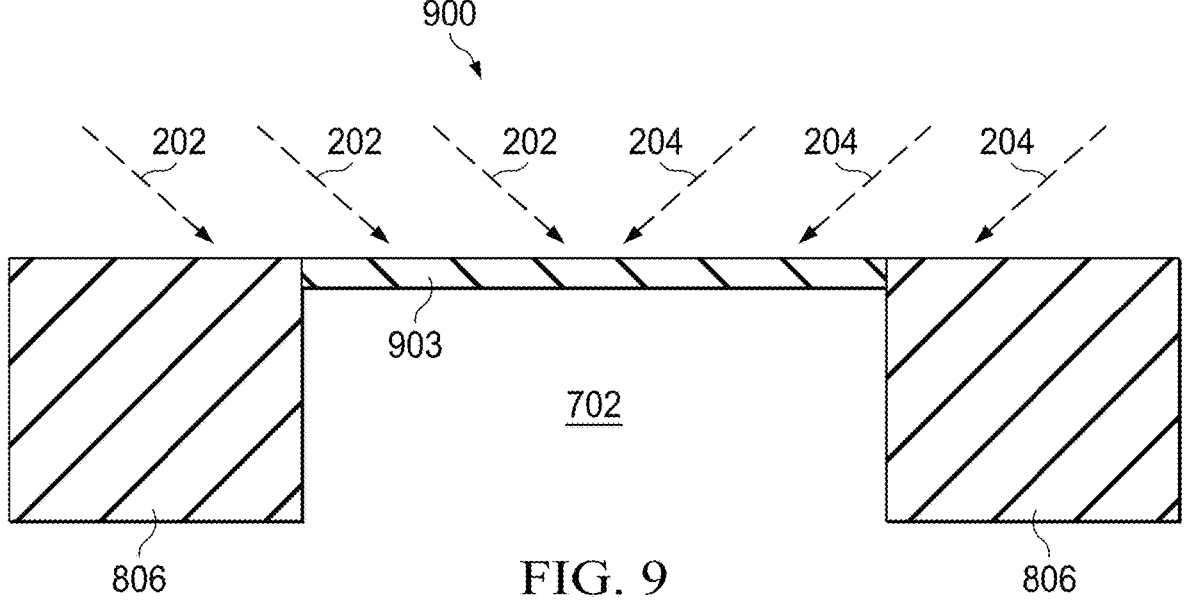
FIG. 9 is an off-the-gate longitudinal-section view of a portion of the first-orientation NMOS transistor through the source/drain implant regions, showing GDL reduction implant directions.

FIG. 9 is an off-the-gate longitudinal-section view of an example second-orientation NMOS transistor 900, which can correspond to second-orientation transistor 104 of FIGS. 1A and 3 and second-orientation NMOS transistor 700 of FIGS. 7A and 7B. The view of FIG. 9 corresponds to the section cut 9 of FIG. 3. An example direction of a first-rotation p-type pocket implant beam is indicated by arrows 202, and an example direction of a second-rotation p-type pocket implant beam is indicated by arrows 204. As viewed in the section cut of FIG. 9, in addition to being surrounded by isolation barrier 806, surface layer 702 may be covered by screen oxide 903. In FIGS. 8 and 9, the pocket implants 202, 204 can be performed at tilt angles of between about 5° from the normal to the top surface 112 of the substrate surface layer 702 and about 45° from the normal, for example, at tilt angles of about 30° from the normal. These pocket implant tilt angles can correspond to tilt angles 430 and 432 in FIG. 4B.

The graphs of FIGS. 10-15 demonstrate how the relative positioning of 2-rotation GDL-reduction implants 114, 116 with respect to orthogonally-oriented first-orientation and second-orientation transistors 102, 104 has the following benefits. First, the 2-rotation GDL-reduction implants 114, 116 reduce the leakage of both the first-orientation transistor 102 and second-orientation transistor 104. Second, the 2-rotation GDL-reduction implants 114, 116 do not substantially reduce the mismatch of the second-orientation transistor 104. Third, the 2-rotation GDL-reduction implants 114, 116 provide substantial leakage reduction for transistors 102, 104 of both orientations. In each of the leakage-versus-performance graphs 1000, 1200, 1400, and 1500 of FIGS. 10, 12, 14, and 15, respectively, it is desirable to fabricate transistors that appear plotted lower down on the vertical scale of the graph (indicating reduced leakage) and further to the right on the horizontal scale of the graph (indicating improved drive current). Implant ion concentrations and implant energies may be optimized to meet targets set for these parameters for various applications.

Figure 10:
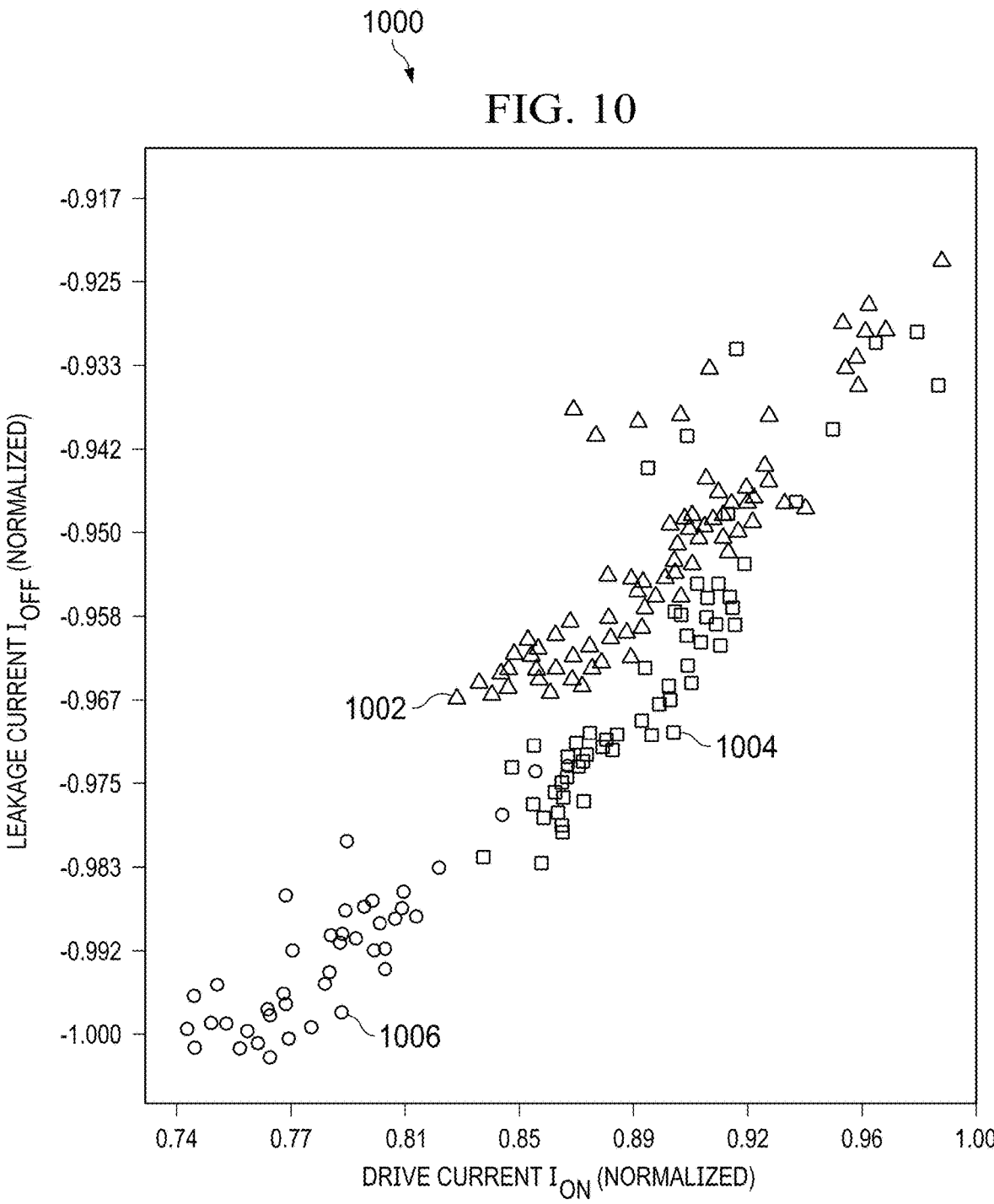
FIGS. 10-15 are graphs illustrating example performance improvements obtained using the 2-rotation GDL-reduction implant for the transistors of the different orientations.

FIG. 10 illustrates a graph 1000 of leakage current $I_{Off}$ versus transistor performance as measured by drive current $I_{On}$ for three different configurations 1002, 1004, 1006 of a first-orientation transistor fabricated as a 1.5 V NMOS transistor, as may be used, for example, in digital logic circuitry. The first configuration 1002 is a baseline configuration that lacks the 2-rotation GDL-reduction implants 114, 116. The second and third configurations 1004, 1006 both implement the 2-rotation GDL-reduction implants 114, 116. As compared to each other, the third configuration 1006 corresponds to higher-concentration pocket implant 202, 204 and the second configuration 1004 corresponds to lower-concentration pocket implant 202, 204. As may be noted from configuration 1004 in FIG. 10 as compared to baseline configuration 1002, the GDL-reduction implant results in a 0.15 decade reduction in diode leakage as measured by $I_{Off}$ for the same drain-source drive current performance as measured by $I_{On}$. A higher-concentration pocket implant can result in even greater leakage control at the expense of $I_{On}$ performance, as shown by comparison of configuration 1006 with baseline configuration 1002 in FIG. 10.

Figure 11:
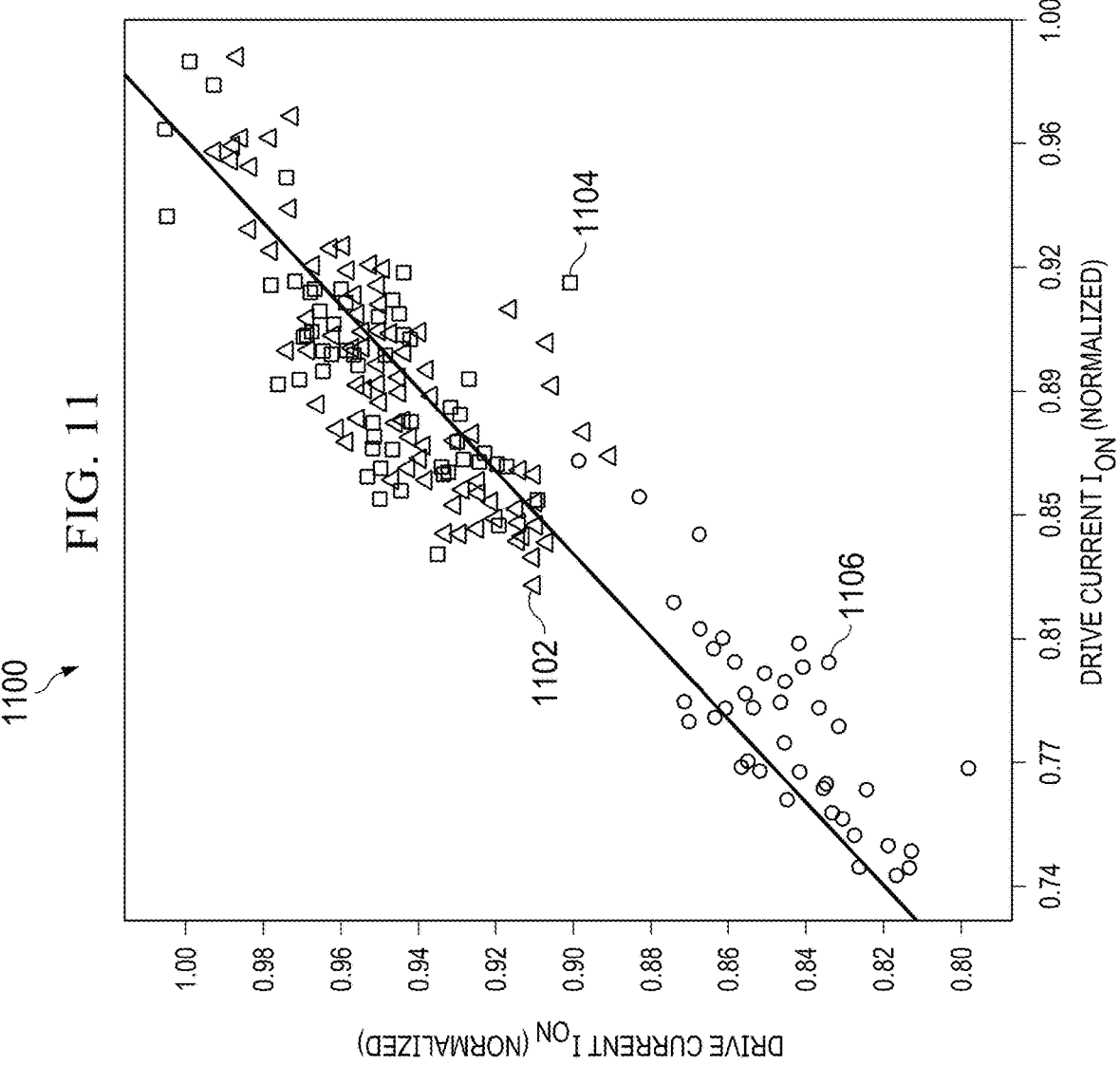

FIG. 11 illustrates, in graph 1100, that the 2-rotation GDL-reduction implants 114, 116 do not change drive current performance in narrow-width transistors represented by baseline configuration 1102, first GDL-reduction implanted configuration 1104, and second GDL-reduction implanted configuration 1106, which can be beneficial in instances where the first-orientation transistor is implemented in memory applications.

Figure 12:
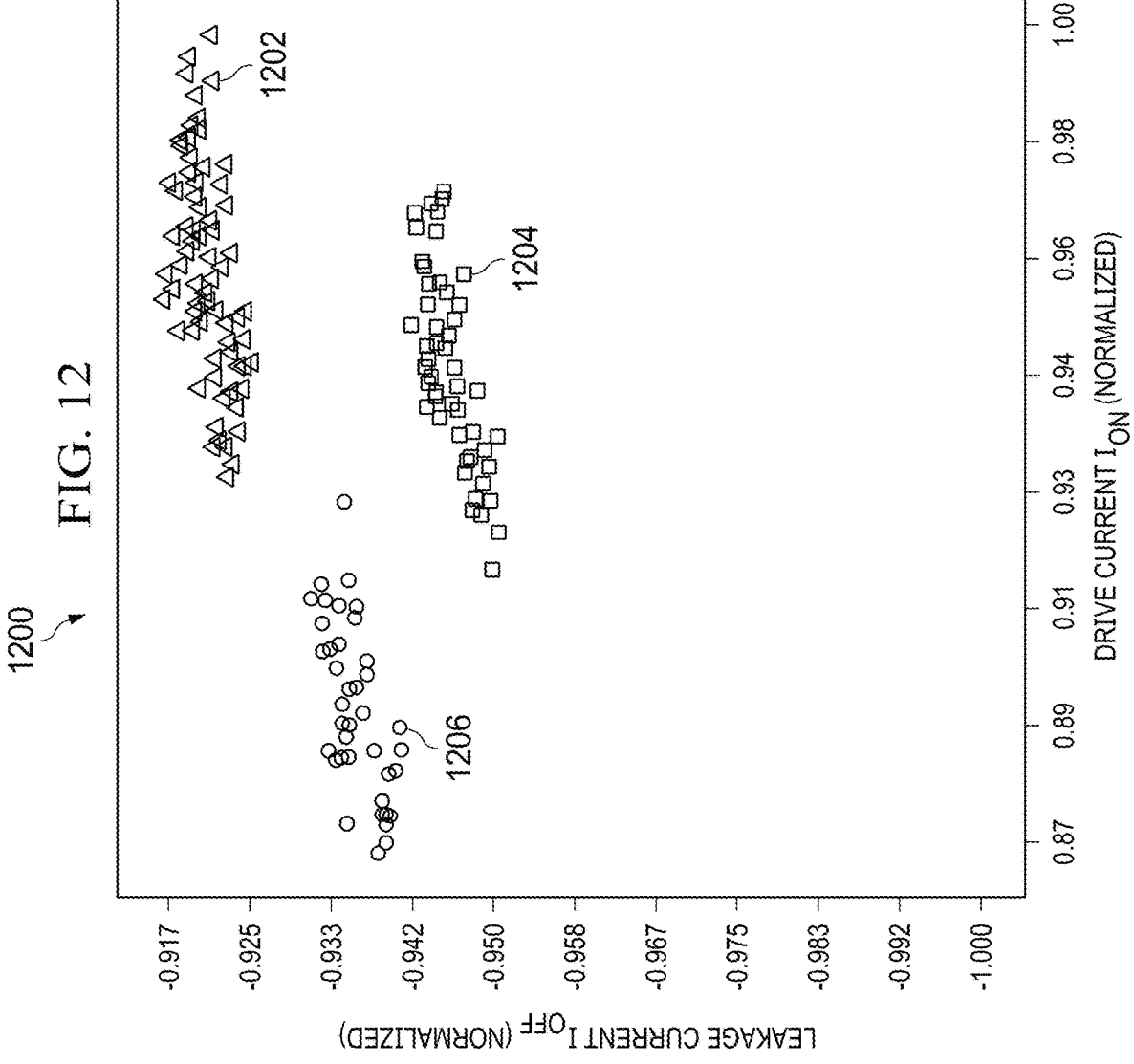
Figure 13:
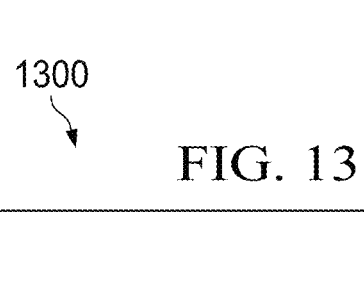

FIG. 12 illustrates a graph 1200 of leakage current $I_{Off}$ versus transistor performance as measured by drive current $I_{On}$ for three different configurations 1202, 1204, 1206 of a first-orientation transistor fabricated as a 1.8 V NMOS transistor, as may be used, for example, in I/O circuitry. The first configuration 1202 is a baseline configuration that lacks the 2-rotation GDL-reduction implants 114, 116. The second and third configurations 1204, 1206 both implement the 2-rotation GDL-reduction implants 114, 116. As compared to each other, the third configuration 1206 corresponds to higher-concentration pocket implant 202, 204, and the second configuration 1204 corresponds to lower-concentration pocket implant 202, 204. As may be noted from configuration 1204 in FIG. 12 as compared to baseline configuration 1202, the GDL-reduction implants result in a 0.25 decade reduction in diode leakage as measured by $I_{Off}$ for roughly the same drain-source current drive performance as measured by $I_{On}$. The reason for this leakage reduction can be explained with regard to FIG. 13, which shows, in graph 1300, a 0.3 decade reduction in GDL for second configuration 1204 as compared to baseline configuration 1202.

Figure 14:
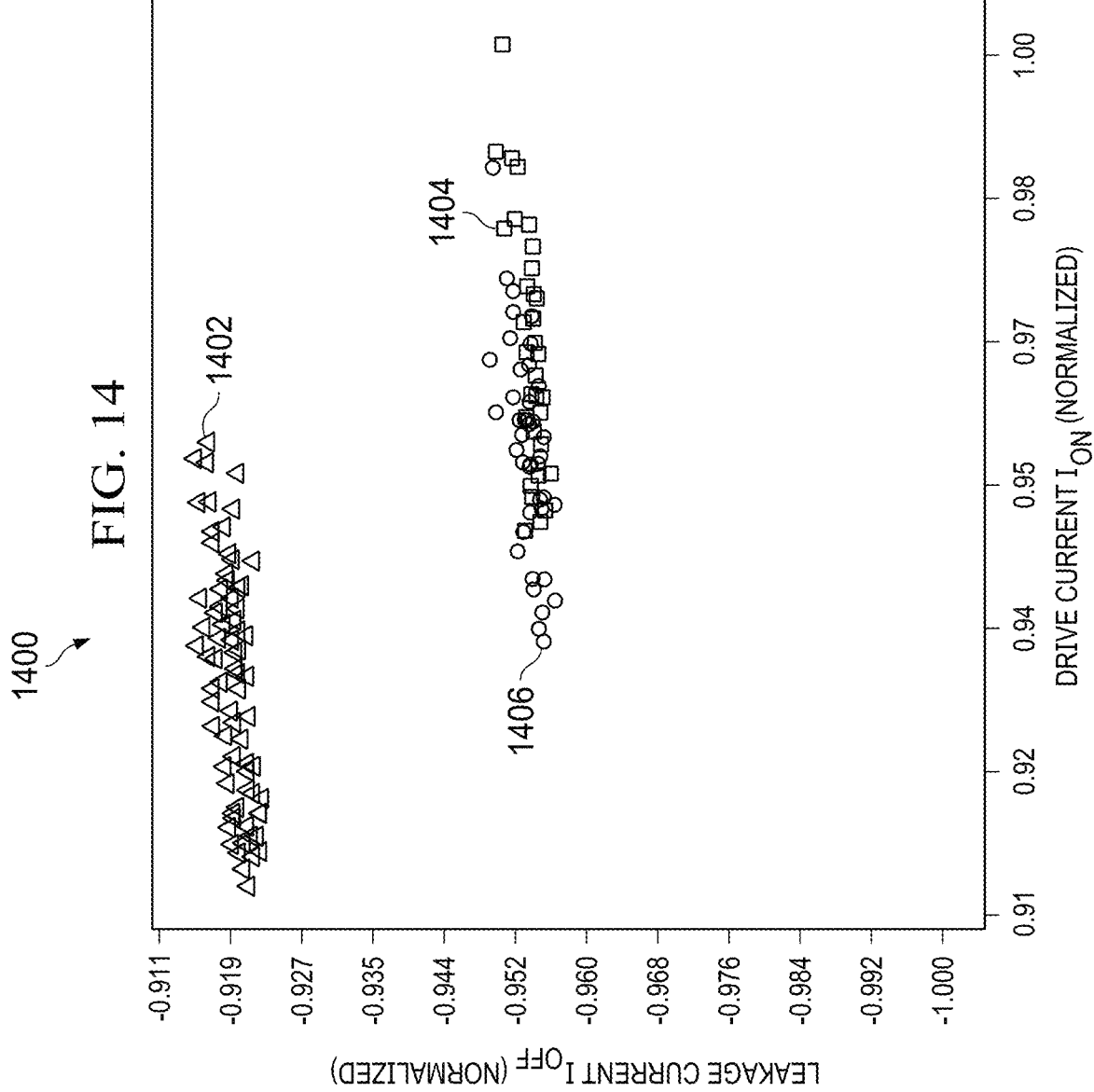

FIG. 14 illustrates a graph 1400 of leakage current $I_{Off}$ versus transistor performance as measured by drive current $I_{On}$ for three different configurations 1402, 1404, 1406 of a second-orientation transistor fabricated as a 1.8 V NMOS transistor, as may be used, for example, in analog circuitry. The first configuration 1402 is a baseline configuration that lacks the 2-rotation GDL-reduction implants 114, 116. The second and third configurations 1404, 1406 both implement the 2-rotation GDL-reduction implants 114, 116. As compared to each other, the third configuration 1406 corresponds to higher-concentration pocket implants 202, 204 and the second configuration 1404 corresponds to lower-concentration pocket implants 202, 204. As may be noted from configuration 1404 in FIG. 14 as compared to baseline configuration 1402, the GDL-reduction implant results in five-tenths of a decade reduction in diode leakage as measured by $I_{Off}$ while also increasing the drain-source drive current performance as measured by $I_{On}$. This drive current performance increase is due to the GDL-reduction implant enhancing the source/drain extensions of the second-orientation transistors, in effect grading the overly highly doped source/drain extensions and thereby reducing band-to-band tunneling at the surface, yielding a lower threshold voltage $V_t$ and reduced source-drain resistance $R_{sd}$ of GDL-reduction-implanted second-orientation transistor configurations 1404, 1406.

Figure 15:
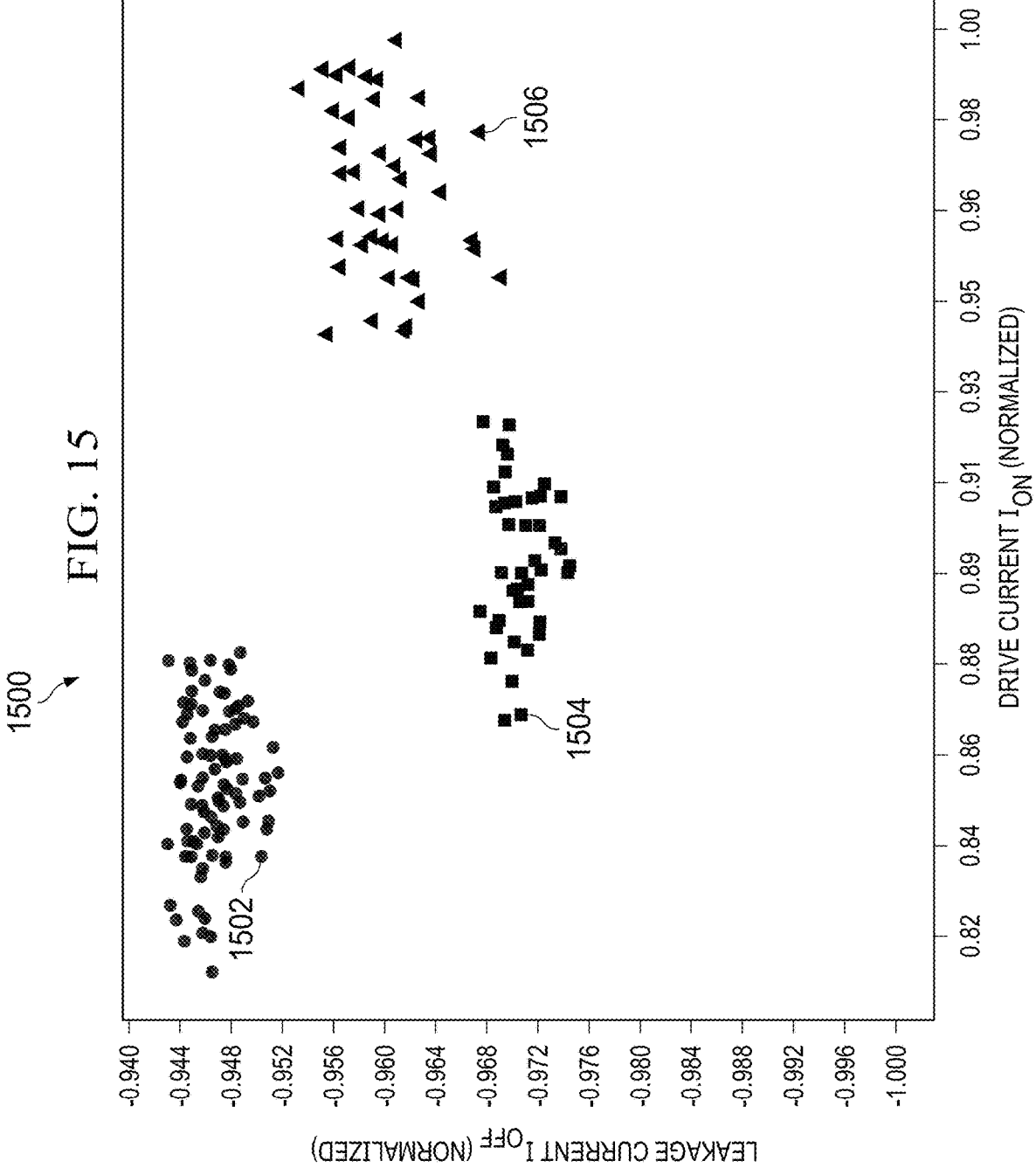

FIG. 15 illustrates a graph 1500 of leakage current $I_{Off}$ versus transistor performance as measured by drive current $I_{On}$ for three different configurations 1502, 1504, 1506 of a second-orientation transistor fabricated as a 1.8 V NMOS transistor, as may be used, for example, in analog circuitry. The first configuration 1502 is a baseline configuration that lacks the 2-rotation GDL-reduction implants 114, 116. The second and third configurations 1504, 1506 both implement the 2-rotation GDL-reduction implants 114, 116 as As implants. As compared to each other, the third configuration 1506 corresponds to higher-dose GDL-reduction implants 114, 116 and the second configuration 1504 corresponds to lower-dose GDL-reduction implants 114, 116. As may be noted from configurations 1504 and 1506 in FIG. 15 as compared to baseline configuration 1502, the GDL-reduction implants 114, 116 result lower leakage as measured by $I_{Off}$ while also increasing the drain-source drive current performance as measured by $I_{On}$, regardless of GDL-reduction implant condition. FIG. 15 also shows that higher doses of GDL-reduction implants result in even greater improvement of transistor performance at the expense of less-improved leakage reduction.

Figure 16:
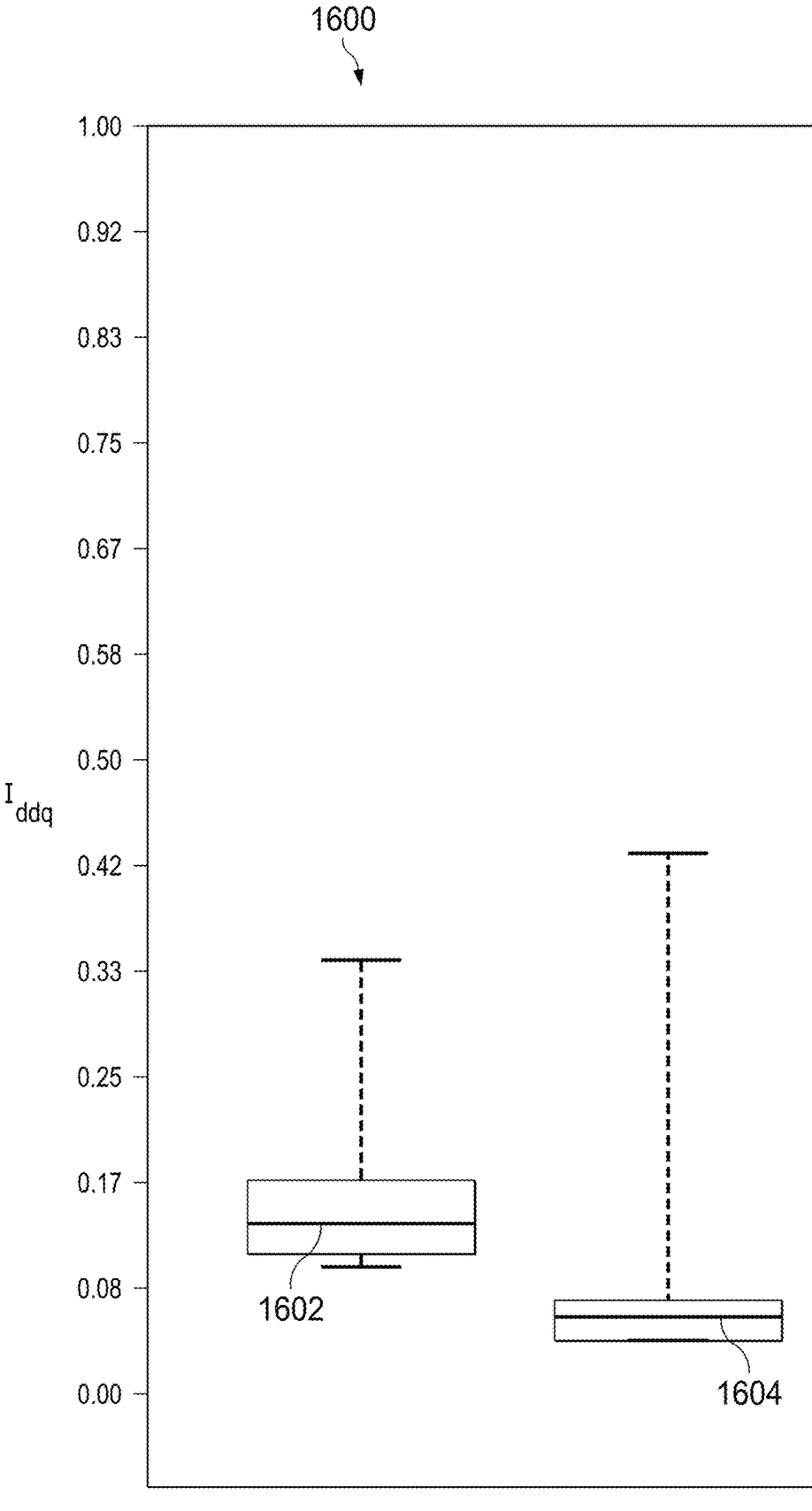
FIG. 16 is a graph illustrating example performance improvement in quiescent-state supply current ($I_{ddq}$) obtained for SRAM circuits fabricated of first-orientation transistors using the 2-rotation GDL-reduction implant, versus a baseline.
Figure 17:
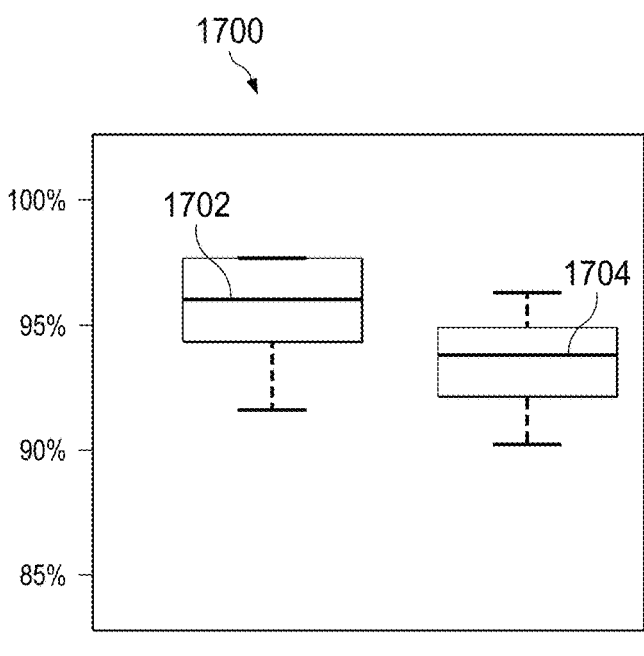
FIG. 17 is a graph illustrating example yield in the SRAM circuits of FIG. 16, versus the baseline.

FIG. 16 shows graph 1600 illustrating quiescent-state supply current ($I_{ddq}$) reduction in CMOS static random-access memory SRAM circuitry implemented using first-orientation transistors fabricated using the 2-rotation GDL-reduction implant described above. As shown, SRAM circuits 1604 fabricated using GDL-reduction-implanted configuration show about half the leakage of SRAM circuits fabricated using baseline configuration 1602. The reason for this improvement is lower GDL in the first-orientation transistors treated with the GDL-reduction implants. The graph 1700 of FIG. 17 shows that median yield is comparable between baseline SRAM circuits 1720 fabricated without the GDL-reduction implants and SRAM circuits 1704 fabricated with the GDL-reduction implants.

Figure 18:
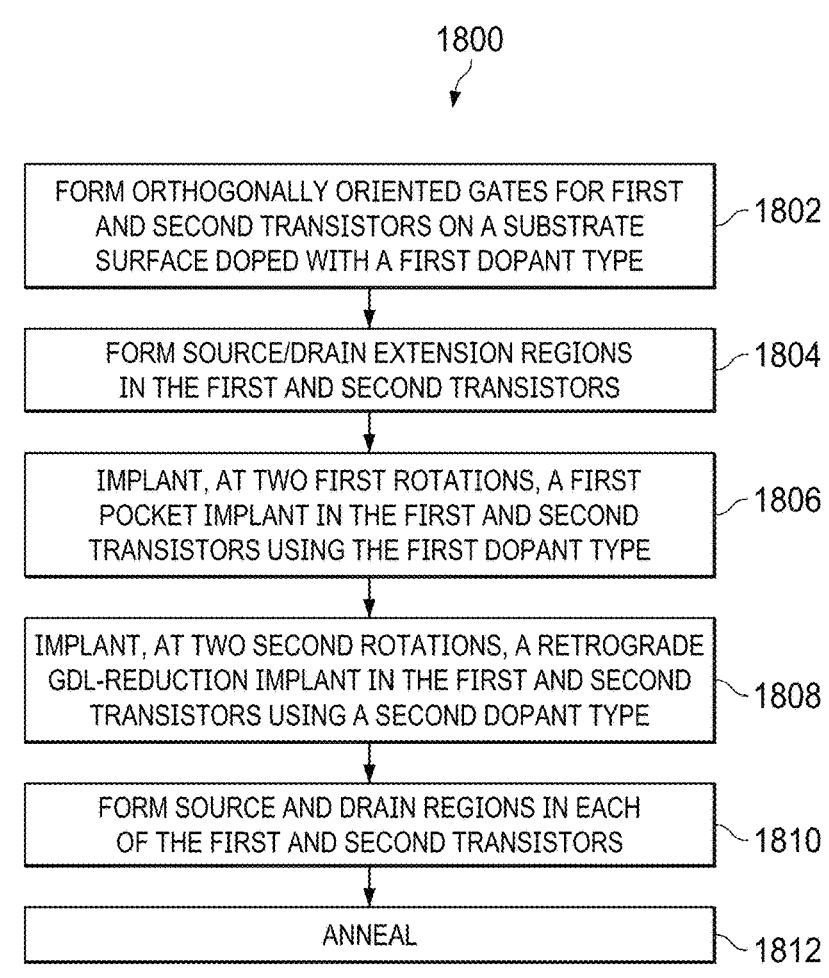
FIG. 18 is a flow chart that shows steps in an example method for forming MOS transistors including GDL-reduction implants using the same mask pattern.

FIG. 18 is a flow chart that shows an example method 1800 for forming MOS transistors of approximately orthogonal top-down-view orientations including two rotations of GDL-reduction implants using the same mask pattern. A substrate having a surface layer with a first conductivity type is provided 1802. The first conductivity type can be provided, for example, by doping the surface layer with a first dopant type. Gates for first and second transistors are formed 1802 on the surface layer. A gate of the first transistor can have a long axis with a first orientation, a gate of the second transistor can have a long axis with the second orientation, and the second orientation can be about orthogonal to the first orientation in a plane of the top surface 108 or 112, e.g., as viewed in a top-down view, such as the view shown in FIG. 1A.

The forming of each of the about orthogonally oriented gates can include forming a gate dielectric layer (e.g., gate dielectric layer 403 or 703) of a gate dielectric material such as silicon oxide, an oxynitride, silicon nitride, barium strontium titanate (BST), lead zirconate titanate (PZT), a silicate, any other high-k material, or any combination or stack thereof, on the substrate (e.g., substrate 401 or 701) having the surface layer (e.g., surface layer 402 or 702), or, in some examples, in a well formed in the surface layer. The forming of each of the about orthogonally oriented gates can further include forming, on top of the gate dielectric layer, a gate electrode (e.g., gate electrode 404 or 704), which may, for example, be made of polycrystalline silicon doped p-type for PMOS or n-type for NMOS, with an optional silicide formed on top, or a metal or metal compound gate such as titanium, aluminum, tungsten, titanium nitride (TiN), titanium aluminum nitride (TiAlN), tantalum, or tantalum nitride (TaN). The forming of each of the about orthogonally oriented gates can further include forming offset spacers on the gate sidewalls, which may be made of oxide, a nitride, an oxynitride or a combination or stack thereof, thereby creating an offset space adjacent to each of the about orthogonally oriented gates.

Source/drain extension regions (e.g., regions 408, 409 or 708, 709) can then be formed 1804 in the first and second transistors. The ordering of this step is only an example, as the source/drain extension regions may be created either earlier or later in method 1800. Implanting a dopant such as arsenic (As) into the surface layer (e.g., surface 402 or 702) or well (e.g., pwell 411 or 711) forms the source/drain extensions. The presence of offset spacers, if any, can create a separation between the source/drain extensions and the gates.

The regions of a pocket dopant may then be formed. A pocket implant (e.g., as indicated by beam arrow 202) is implanted 1806 adjacent the first and second gates 106, 110 using a first dopant having the first conductivity type. This may be done using a masking pattern (e.g., as indicated by resist 428 and 728). The pocket implant has a first rotation angle and a first implantation angle (e.g., as indicated by angle 430), which is measured relative to a normal of surface layer 402 or 702. After a subsequent annealing 1812 of method 1800, the pocket implant provides a first pocket region (e.g., region 421) in the first transistor 102, 400, and counterdoped regions (e.g., regions 723, 722, 724) in the second transistor 104, 700. The pocket implant can be self-aligned to the edge of the gate stack (gate edge). As an example, the pocket implant dose may be of boron for NMOS or phosphorous for PMOS in the range of between about $1.5 \times 10^{13}$ atoms/cm$^2$ and about $6 \times 10^{13}$ atoms/cm$^2$ at an energy level of between about 1 keV and about 15 keV for boron, or an energy for other species to obtain the same projected range as boron implanted at between about 1 keV and about 15 keV. The implantation angle of the pocket implant 1806 can, for example, have a tilt between about 5° and about 45°, e.g., about 30°, relative to the normal of the top of the surface layer 402. The pocket implant dose can be adjusted (e.g., at a higher dose) to obtain the same $V_t$ as the $V_t$ resulting from a conventional single pocket dose without the retrograde GDL-reduction ion implant(s) in step 1808 described below.

Before or after the first pocket implant 1806, a retrograde GDL-reduction implant (e.g., as indicated by beam arrow 114) is implanted 1808 adjacent the first and second gates 106, 110 using a second dopant having a second opposite conductivity type, that is, a conductivity type opposite the first conductivity type. The GDL-reduction implant has a second rotation angle, differing from the first rotation angle by at least 10°, and a second implantation angle (e.g., as indicated by angle 730), which is measured relative to a normal of surface layer 402 or 702. In some examples, the first rotation angle is less than 45° and the second rotation angle is greater than 45°. For example, the first rotation angle can be about 0° and the second rotation angle can be about 90°. The retrograde GDL-reduction implant may be performed using the same masking pattern as the pocket implant (e.g., as indicated by resist 428 and 728). After the subsequent annealing 1812 of method 1800, the retrograde GDL-reduction implant provides retrograde GDL-reduction regions (e.g., regions 422, 424) in the first transistor 102, 400, and counterdoped GDL-reduction regions (e.g., regions 721 extending from the source/drain regions 705, 706 to underneath the gate 110) in the second transistor 104, 700. The retrograde GDL-reduction implant is also self-aligned to the edge of the gate stack (gate edge). As an example, the retrograde GDL-reduction implant can be of As or Sb for NMOS or In for PMOS, in a dose range of between about $1 \times 10^{13}$ atoms/cm$^2$ and about $1.5 \times 10^{14}$ atoms/cm$^2$ at an energy level of between about 15 keV and about 120 keV for As, or an energy for other species to obtain the same projected range as As at between about 15 keV and about 120 keV. The implantation angle of the retrograde GDL-reduction implant 1808 relative to a normal to the surface layer 702 (e.g., as indicated by angle 730) can, for example, have a tilt between about 5° and about 45°, e.g., about 30°, relative to the normal of the top of the surface layer 702, and can be the same angle or similar angle (e.g., within ±10°) as used for the pocket implant 1806.

In some examples, the implantation 1806 of the pocket implant can further include implanting a second pocket implant (e.g., as indicated by beam arrow 204) adjacent the first and second gates 106, 110 using the first dopant. The second pocket implant can have a third rotation angle opposite the first rotation angle and a third implantation angle (e.g., as indicated by angle 432). The second pocket implant can be done before or after the retrograde GDL-reduction implant. In some examples, the implantation 1808 of the retrograde GDL-reduction implant can further include implanting a second retrograde GDL-reduction implant (e.g., as indicated by beam arrow 116) adjacent the first and second gates 106, 110 using the second dopant. The second GDL-reduction implant can have a fourth rotation angle opposite the second rotation angle and a fourth implantation angle (e.g., as indicated by angle 732). The second retrograde GDL-reduction implant can be done before or after the second pocket implant. As an example, the third rotation angle can be about 180° and the second rotation angle can be about 270°. In some examples, the third and fourth implantation angles have a tilt between about 5° and about 45°, e.g., about 30°, relative to the normal of the top of the surface layer 402, 702.

The method 1800 can further comprise implanting at least one of fluorine, nitrogen, and/or carbon co-implants using the same masking pattern as the pocket implants. Si or Ge may also be used as co-implant species. The co-implant dose (e.g., fluorine) may be in the range of $5 \times 10^{13}$ atoms/cm$^2$ to $1 \times 10^{15}$ atoms/cm$^2$. However, any level of co-implant may be used. The co-implant energy can be selected to implant the co-implant species to approximately the same depth as the pocket dopants. The co-implant can precede implants 1806 and 1808. The ordering of the implants 1806 and 1808 is by example since each of the pocket implants may be created either earlier or later in the process, prior to annealing 1812.

Source and drain regions are formed 1810 in each of the first and second transistors, such as (n+) source 405 and 705 and (n+) drain 406 and 706 for NMOS. For NMOS, a dopant such as As and/or phosphorus is implanted into the surface layer 402 or 702 at the source region and the drain region. The presence of source/drain spacers, if any, can create separation between the drain extensions 408, 409, 708, 709 and the (n+) source and drain 405, 406, 705, 706. Co-implants such as nitrogen and/or carbon and/or fluorine may be implanted along with the source/drain dopants.

Following implantation, annealing 1812 provides high temperature thermal process conditions sufficient to cause the dopants in the source, drain, drain extension, and pocket regions (e.g., 421, 422, 424 for NMOS) to be activated and to diffuse. One result is that there is the desired concentration profile of pocket dopants, for NMOS being the first pocket regions 421 relative to the drain extension 408, 409 junctions and in the channel region near the gate dielectric layer 403, and desirable concentration profile of retrograde GDL-reduction regions 422, 424 to lower the E field at the drain extensions 408, 409, and (n+) S 405/D 406 junctions thus lowering the GDL and leakage of the first transistor. Another result is that there is the desired concentration profile of GDL-reduction dopants, for NMOS being the GDL-reduction regions 721 relative to the drain extension 708, 709 junctions and in the channel region near the gate dielectric layer 703, and desirable concentration profile of dopants of the first dopant type in regions 722, 724 to reduce the resistance of the drain extensions of the second transistor and improve its performance while also lowering its GDL and leakage, and also improving noise and mismatch performance of the second transistor. The manufacturing process continues generally through conventional back end of the line (BEOL) processing including multi-layer metallization and passivation until the final structure of the IC is completed.

As an example, after the annealing 1812, the pocket implants (as indicated by beam arrows 202, 204) provide first pocket regions 421 in the first transistor 102, 400 and the retrograde GDL-reduction implants (as indicated by beam arrows 114, 116) provide overlaps with the first pocket regions in the first transistor 102, 400 to form first and second counterdoped pocket portions 422, 424 within the first pocket regions 421 in the first transistor 102, 400. The second counterdoped pocket portion 424 in the first transistor 102, 400 is type inverted, where a concentration of the second dopant exceeds a concentration of the first dopant. As another example, after the annealing 1812, the GDL-reduction implants (as indicated by beam arrows 114, 116) provide GDL-reduction regions 721 in the second transistor 104, 700 and the pocket implants provide an overlap with the GDL-reduction regions 721 in the second transistor 104, 700 to form first and second counterdoped pocket portions 722, 724 within the GDL-reduction regions 721 in the second transistor 104, 700, the second counterdoped pocket portion 724 in the second transistor 104, 700 being type inverted where a concentration of the first dopant exceeds a concentration of the second dopant.

The different beneficial properties of the first transistor and second transistor are achieved in part by the different symmetries of implants between the first and second transistor. These different symmetries are best illustrated by comparison of FIG. 2 (corresponding to the first transistor) with FIG. 3 (corresponding to the second transistor), by comparison of FIG. 4B (corresponding to the first transistor) with FIG. 7B (corresponding to the second transistor), or by comparison with FIG. 5 (corresponding to the first transistor) with FIG. 8 (corresponding to the second transistor). In the first transistor, the direction of the GDL-reduction implants 114, 116, 1808 is more parallel than perpendicular to the orientation of the long axis of the gate, and the GDL-reduction implant therefore lowers GDL in the first transistor, even if it may not necessarily substantially affect the performance of the first transistor. Also in the first transistor, the direction of the pocket implant 202, 204, 1806 is more perpendicular than parallel to the orientation of the long axis of the gate, and therefore sets the threshold voltage and controls the short channel effects of the first transistor. By contrast, in the second transistor, the direction of the GDL-reduction implants 114, 116, 1808 is more perpendicular than parallel to the orientation of the long axis of the gate, and the GDL-reduction implant therefore lowers resistance in the drain extensions of the second transistor and improves its performance while also lowering its GDL. Also in the second transistor, the direction of the pocket implant 202, 204, 1806 is more parallel than perpendicular to the orientation of the long axis of the gate, and therefore does not intrude into the channel of the second transistor, thereby improving noise and mismatch performance of the second transistor. Accordingly, instances of the second transistor may be well suited to be used in matched pairs in analog circuits.

Examples can be integrated into a variety of assembly flows to form a variety of different semiconductor IC devices and related products. The assembly can comprise single semiconductor die or multiple semiconductor die, such as package-on-package (PoP) configurations comprising a plurality of stacked semiconductor die. A variety of package substrates may be used. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, CMOS, BiCMOS, and MEMS.

In this description, the term "based on" means based at least in part on. Also, in this description, the term "couple" or "couples" means either an indirect or direct wired or wireless connection. Thus, if a first device, element, or component couples to a second device, element, or component, that coupling may be through a direct coupling or through an indirect coupling via other devices, elements, or components and connections. Similarly, a device, element, or component that is coupled between a first component or location and a second component or location may be through a direct connection or through an indirect connection via other devices, elements, or components and/or couplings.

Modifications are possible in the described embodiments, and other embodiments are possible, within the scope of the claims.

What is claimed is:

1. A metal-oxide-semiconductor (MOS) transistor, comprising:
    a semiconductor substrate surface layer having a well region having a first conductivity type;
    a gate formed over the well region;
    a source/drain region and a source/drain extension to the source/drain region formed in the surface layer, both having a second conductivity type, the source/drain extension extending under the gate;
    a gate edge diode leakage (GDL) reduction region having the second conductivity type extending from under the gate towards the source/drain region;
    a first counterdoped pocket portion extending from the GDL-reduction region toward the source/drain region and having the second conductivity type and a lower charge carrier density than the GDL-reduction region; and
    a second counterdoped pocket portion extending from the first counterdoped pocket portion to the source/drain region and having the first conductivity type and a lower charge carrier concentration than the well region.

2. The MOS transistor of claim 1, wherein the MOS transistor is an NMOS transistor and a dopant for the GDL-reduction region includes arsenic or antimony.

3. The MOS transistor of claim 1, wherein the MOS transistor is a PMOS transistor and a dopant for the GDL-reduction region includes indium.

4. The MOS transistor of claim 1, implemented on an integrated circuit (IC) as one of a matched pair of transistors in an analog circuit device.

5. An integrated circuit (IC) comprising:
    a substrate having a surface layer having a top surface;
    first and second metal-oxide-semiconductor (MOS) transistors formed in or over the surface layer, each of the first and second MOS transistors comprising:
        a gate formed over a corresponding well region having a first conductivity type, the gate of the first MOS transistor having a long axis with a first orientation and the gate of the second MOS transistor having a long axis with a second orientation that is about orthogonal to the first orientation in a plane of the top surface;

a source/drain region and a source/drain extension to the source/drain region formed in the surface layer, both having a second conductivity type, the source/drain extension extending under the gate;

the first MOS transistor further comprising:

a pocket region having the first conductivity type extending from under the gate of the first MOS transistor to the source/drain region of the first MOS transistor;

a first gate-edge diode leakage (GDL) reduction portion extending from the pocket region toward the source/drain region of the first MOS transistor and having the first conductivity type and a lower charge carrier density than the pocket region; and a second GDL-reduction portion extending from the first GDL-reduction portion to the source/drain region of the first MOS transistor and having the second conductivity type and a lower charge carrier concentration than the source/drain region of the first MOS transistor; and the second MOS transistor further comprising:

a GDL-reduction region having the second conductivity type extending from under the gate of the second MOS transistor to the source/drain region of the second MOS transistor;

a first counterdoped pocket portion extending from the GDL-reduction region toward the source/drain region of the second MOS transistor and having the second conductivity type and a lower charge carrier density than the GDL-reduction region; and a second counterdoped pocket portion extending from the first counterdoped pocket portion to the source/drain region and having the first conductivity type and a lower charge carrier concentration than the well region of the second MOS transistor.

6. The IC of claim 5, wherein the first and second MOS transistors are NMOS transistors and a dopant for the GDL reduction region includes arsenic or antimony.

7. The IC of claim 5, wherein the first and second MOS transistors are PMOS transistors and a dopant for the GDL reduction region includes indium.

8. The MOS transistor of claim 1, wherein the first counterdoped pocket portion is under an edge of the gate.

9. An integrated circuit (IC) comprising:

a substrate having a surface layer having a top surface;

a metal-oxide-semiconductor (MOS) transistor formed in or over the surface layer, including:

a gate formed over a well region having a first conductivity type;

a source/drain region and a source/drain extension to the source/drain region formed in the surface layer, both having a second conductivity type, the source/drain extension extending under the gate;

a pocket region having the first conductivity type extending from under the gate to the source/drain region;

a first gate-edge diode leakage (GDL) reduction portion extending from the pocket region toward the source/drain region and having the first conductivity type and a lower charge carrier density than the pocket region; and a second GDL-reduction portion extending from the first GDL-reduction portion to the source/drain region and having the second conductivity type and a lower charge carrier concentration than the source/drain region.

10. The IC of claim 9, wherein the MOS transistor is a first MOS transistor having a first gate, first well region and first source/drain region, and further comprising a second MOS transistor having a second gate over a second well region, second source/drain region and a second source/drain extension to the second source/drain region formed in the surface layer, both having the second conductivity type, the second source/drain extension extending under the second gate;

a GDL reduction region having the second conductivity type extending from under the second gate towards the second source/drain region;

a first counterdoped pocket portion extending from the GDL-reduction region toward the second source/drain region and having the second conductivity type and a lower charge carrier density than the GDL-reduction region; and a second counterdoped pocket portion extending from the first counterdoped pocket portion to the second source/drain region and having the first conductivity type and a lower charge carrier concentration than the second well region.

11. The IC of claim 10, wherein the first gate has a first orientation, and the second gate has a different second orientation.

12. The IC of claim 11, wherein the second orientation is about orthogonal to the first orientation.

13. The IC of claim 9, wherein the first GDL reduction portion is under an edge of the gate.

14. The IC of claim 9, wherein the MOS transistor is an NMOS transistor.

15. The IC of claim 9, wherein the GDL-reduction region is doped with arsenic or antimony.

16. The IC of claim 9, wherein the first GDL-reduction portion is P-type and the second GDL-reduction portion is N-type.

* * * * *